(12) United States Patent
Baker

(10) Patent No.: US 12,113,525 B2
(45) Date of Patent: Oct. 8, 2024

(54) INTELLIGENT ELECTRICAL SWITCHES

(71) Applicant: Amber Semiconductor, Inc., Dublin, CA (US)

(72) Inventor: Damon Matthew Baker, Elsinore, UT (US)

(73) Assignee: Amber Semiconductor, Inc., Dublin, CA (US)

( * ) Notice: Subject to any disclaimer, the term of this patent is extended or adjusted under 35 U.S.C. 154(b) by 227 days.

(21) Appl. No.: 17/958,319

(22) Filed: Sep. 30, 2022

(65) Prior Publication Data

US 2023/0121575 A1    Apr. 20, 2023

Related U.S. Application Data

(60) Provisional application No. 63/250,716, filed on Sep. 30, 2021.

(51) Int. Cl.
*H03K 17/693* (2006.01)
*H01H 9/16* (2006.01)
(Continued)

(52) U.S. Cl.
CPC .............. *H03K 17/693* (2013.01); *H01H 9/16* (2013.01); *H01H 9/54* (2013.01); *H02M 7/155* (2013.01);
(Continued)

(58) Field of Classification Search
CPC .......... H01H 9/16; H01H 9/54; H02M 7/155; H03K 17/693; H03K 17/18; H03K 17/725;
(Continued)

(56) References Cited

U.S. PATENT DOCUMENTS 3,638,102 A    1/1972 Pelka
3,777,253 A   12/1973 Callan
(Continued)

FOREIGN PATENT DOCUMENTS

CA    2799865 A1 *  6/2013  .......... H01H 23/143
CN    109075551 B     1/2021
(Continued)

OTHER PUBLICATIONS

U.S. Appl. No. 17/660,785 filed in the name of Mark Telefus et al. entitled "Solid-State Ground-Fault Circuit Interrupter."
(Continued)

*Primary Examiner* — Kevin J Comber
(74) *Attorney, Agent, or Firm* — Ryan, Mason & Lewis, LLP

(57) ABSTRACT

An electrical switch comprises a first terminal, a second terminal, a third terminal, a solid-state AC switch connected in an electrical path between the first terminal and the second terminal, and a microcontroller configured to control operation of the solid-state AC switch to control power flow between the first terminal and the second terminal. The microcontroller is configured to communicate with a second electrical switch over a data line that is connected to the third terminal of the electrical switch and to the second electrical switch, to implement multi-way switch control for controlling power to a load. The microcontroller is configured, upon power up, to perform a master/slave self-identification process to determine whether to operate the electrical switch in a master mode or a slave mode, based on sensing a voltage level on the data line that is connected to the third terminal of the electrical switch.

20 Claims, 6 Drawing Sheets

(51) Int. Cl.
*H01H 9/54* (2006.01)
*H02M 7/155* (2006.01)
*H03K 17/725* (2006.01)
*H05B 47/11* (2020.01)

(52) U.S. Cl.
CPC ........... *H03K 17/725* (2013.01); *H05B 47/11* (2020.01); *H03K 2217/0009* (2013.01)

(58) Field of Classification Search
CPC . H03K 2217/94089; H03K 2217/0009; H03K 2217/94094; H05B 47/11; Y02B 20/40
USPC .............................. 361/90; 307/112; 327/408
See application file for complete search history.

(56) References Cited

U.S. PATENT DOCUMENTS

| | | |
|---|---|---|
| 4,074,345 A | 2/1978 | Ackermann |
| 4,127,895 A | 11/1978 | Krueger |
| 4,245,148 A | 1/1981 | Gisske et al. |
| 4,245,184 A | 1/1981 | Billings et al. |
| 4,245,185 A | 1/1981 | Mitchell et al. |
| 4,257,081 A | 3/1981 | Sauer et al. |
| 4,466,071 A | 8/1984 | Russell, Jr. |
| 4,487,458 A | 12/1984 | Janutka |
| 4,581,540 A | 4/1986 | Guajardo |
| 4,631,625 A | 12/1986 | Alexander et al. |
| 4,636,907 A | 1/1987 | Howell |
| 4,649,302 A | 3/1987 | Damiano et al. |
| 4,653,084 A | 3/1987 | Ahuja |
| 4,682,061 A | 7/1987 | Donovan |
| 4,685,046 A | 8/1987 | Sanders |
| 4,709,296 A | 11/1987 | Hung et al. |
| 4,760,293 A | 7/1988 | Hebenstreit |
| 4,766,281 A | 8/1988 | Buhler |
| 4,812,995 A | 3/1989 | Girgis et al. |
| 4,888,504 A | 12/1989 | Kinzer |
| 4,945,345 A | 7/1990 | Proctor et al. |
| 5,121,282 A | 6/1992 | White |
| 5,161,107 A | 11/1992 | Mayeaux et al. |
| 5,276,737 A | 1/1994 | Micali |
| 5,307,257 A | 4/1994 | Fukushima |
| 5,371,646 A | 12/1994 | Biegelmeier |
| 5,410,745 A | 4/1995 | Friesen et al. |
| 5,559,656 A | 9/1996 | Chokhawala |
| 5,646,514 A | 7/1997 | Tsunetsugu |
| 5,654,880 A | 8/1997 | Brkovic et al. |
| 5,731,732 A | 3/1998 | Williams |
| 5,793,596 A | 8/1998 | Jordan et al. |
| 5,796,274 A | 8/1998 | Willis et al. |
| 5,844,759 A | 12/1998 | Hirsh et al. |
| 5,859,756 A | 1/1999 | Pressman et al. |
| 5,870,009 A | 2/1999 | Serpinet et al. |
| 5,933,305 A | 8/1999 | Schmalz et al. |
| 6,041,322 A | 3/2000 | Meng et al. |
| 6,081,123 A | 6/2000 | Kasbarian et al. |
| 6,111,494 A | 8/2000 | Fischer et al. |
| 6,115,267 A | 9/2000 | Herbert |
| 6,141,197 A | 10/2000 | Kim et al. |
| 6,160,689 A | 12/2000 | Stolzenberg |
| 6,167,329 A | 12/2000 | Engel et al. |
| 6,169,391 B1 | 1/2001 | Lei |
| 6,188,203 B1 | 2/2001 | Rice et al. |
| 6,300,748 B1 | 10/2001 | Miller |
| 6,369,554 B1 | 4/2002 | Aram |
| 6,483,290 B1 | 11/2002 | Hemminger et al. |
| 6,515,434 B1 | 2/2003 | Biebl |
| 6,538,906 B1 | 3/2003 | Ke et al. |
| 6,756,998 B1 | 6/2004 | Bilger |
| 6,788,512 B2 | 9/2004 | Vicente et al. |
| 6,807,035 B1 | 10/2004 | Baldwin et al. |
| 6,813,720 B2 | 11/2004 | Leblanc |
| 6,839,208 B2 | 1/2005 | Macbeth et al. |
| 6,843,680 B2 | 1/2005 | Gorman |
| 6,906,476 B1 | 6/2005 | Beatenbough et al. |
| 6,984,988 B2 | 1/2006 | Yamamoto |
| 7,045,723 B1 | 5/2006 | Projkovski |
| 7,053,626 B2 | 5/2006 | Monter et al. |
| 7,110,225 B1 | 9/2006 | Hick |
| 7,148,796 B2 | 12/2006 | Joy et al. |
| 7,164,238 B2 | 1/2007 | Kazanov et al. |
| 7,292,419 B1 | 11/2007 | Nemir |
| 7,297,603 B2 | 11/2007 | Robb et al. |
| 7,304,828 B1 | 12/2007 | Shvartsman |
| D558,683 S | 1/2008 | Pape et al. |
| 7,319,574 B2 | 1/2008 | Engel |
| D568,253 S | 5/2008 | Gorman |
| 7,367,121 B1 | 5/2008 | Gorman |
| 7,586,285 B2 | 9/2009 | Gunji |
| 7,595,680 B2 | 9/2009 | Morita et al. |
| 7,610,616 B2 | 10/2009 | Masuouka et al. |
| 7,633,727 B2 | 12/2009 | Zhou et al. |
| 7,643,256 B2 | 1/2010 | Wright et al. |
| 7,693,670 B2 | 4/2010 | Durling et al. |
| 7,715,216 B2 | 5/2010 | Liu et al. |
| 7,729,147 B1 | 6/2010 | Wong et al. |
| 7,731,403 B2 | 6/2010 | Lynam et al. |
| 7,746,677 B2 | 6/2010 | Unkrich |
| 7,821,023 B2 | 10/2010 | Yuan et al. |
| D638,355 S | 5/2011 | Chen |
| 7,936,279 B2 | 5/2011 | Tang et al. |
| 7,948,719 B2 | 5/2011 | Xu |
| 8,124,888 B2 | 2/2012 | Etemad-Moghadam et al. |
| 8,256,675 B2 | 9/2012 | Baglin et al. |
| 8,295,950 B1 | 10/2012 | Wordsworth et al. |
| 8,374,729 B2 | 2/2013 | Chapel et al. |
| 8,463,453 B2 | 6/2013 | Parsons, Jr. |
| 8,482,885 B2 | 7/2013 | Billingsley et al. |
| 8,560,134 B1 | 10/2013 | Lee |
| 8,649,883 B2 | 2/2014 | Lu et al. |
| 8,664,886 B2 | 3/2014 | Ostrovsky |
| 8,717,720 B2 | 5/2014 | DeBoer |
| 8,718,830 B2 | 5/2014 | Smith |
| 8,781,637 B2 | 7/2014 | Eaves |
| 8,817,441 B2 | 8/2014 | Callanan |
| 8,890,371 B2 | 11/2014 | Gotou |
| D720,295 S | 12/2014 | Dodal et al. |
| 8,947,838 B2 | 2/2015 | Yamai et al. |
| 9,054,587 B2 | 6/2015 | Neyman |
| 9,055,641 B2 | 6/2015 | Shteynberg et al. |
| 9,287,792 B2 | 3/2016 | Telefus et al. |
| 9,325,516 B2 | 4/2016 | Pera et al. |
| 9,366,702 B2 | 6/2016 | Steele et al. |
| 9,439,318 B2 | 9/2016 | Chen |
| 9,443,845 B1 | 9/2016 | Stafanov et al. |
| 9,502,832 B1 | 11/2016 | Ullahkhan et al. |
| 9,509,083 B2 | 11/2016 | Yang |
| 9,515,560 B1 | 12/2016 | Telefus et al. |
| 9,577,420 B2 | 2/2017 | Ostrovsky et al. |
| 9,621,053 B1 | 4/2017 | Telefus |
| 9,755,630 B2 | 9/2017 | Urciuoli |
| 9,774,182 B2 | 9/2017 | Phillips |
| 9,836,243 B1 | 12/2017 | Chanler et al. |
| 9,883,554 B2 | 1/2018 | Lynch |
| D814,424 S | 4/2018 | DeCosta |
| 9,965,007 B2 | 5/2018 | Amelio et al. |
| 9,990,786 B1 | 6/2018 | Ziraknejad |
| 9,991,633 B2 | 6/2018 | Robinet |
| 10,072,942 B2 | 9/2018 | Wootton et al. |
| 10,076,006 B2 | 9/2018 | Kahlman et al. |
| 10,101,716 B2 | 10/2018 | Kim |
| 10,186,027 B1 | 1/2019 | Hicken et al. |
| 10,187,944 B2 | 1/2019 | MacAdam et al. |
| 10,469,077 B2 | 11/2019 | Telefus et al. |
| 10,548,188 B2 | 1/2020 | Cheng et al. |
| D879,056 S | 3/2020 | Telefus |
| D881,144 S | 4/2020 | Telefus |
| 10,615,713 B2 | 4/2020 | Telefus et al. |
| 10,645,536 B1 | 5/2020 | Barnes et al. |
| 10,756,662 B2 | 8/2020 | Steiner et al. |
| 10,812,072 B2 | 10/2020 | Telefus et al. |
| 10,812,282 B2 | 10/2020 | Telefus et al. |
| 10,819,336 B2 | 10/2020 | Telefus et al. |
| 10,834,792 B2 | 11/2020 | Telefus et al. |

(56) References Cited

U.S. PATENT DOCUMENTS

| | | |
|---|---|---|
| 10,887,447 B2 | 1/2021 | Jakobsson et al. |
| 10,931,473 B2 | 2/2021 | Telefus et al. |
| 10,936,749 B2 | 3/2021 | Jakobsson |
| 10,951,435 B2 | 3/2021 | Jakobsson |
| 10,985,548 B2 | 4/2021 | Telefus |
| 10,992,236 B2 | 4/2021 | Telefus et al. |
| 10,993,082 B2 | 4/2021 | Jakobsson |
| 11,050,236 B2 | 6/2021 | Telefus et al. |
| 11,056,981 B2 | 7/2021 | Telefus |
| 11,064,586 B2 | 7/2021 | Telefus et al. |
| 11,114,947 B2 | 9/2021 | Telefus et al. |
| 11,170,964 B2 | 11/2021 | Telefus et al. |
| 11,197,153 B2 | 12/2021 | Jakobsson |
| 11,205,011 B2 | 12/2021 | Jakobsson et al. |
| 11,245,339 B2 | 2/2022 | Telefus et al. |
| 11,295,735 B1 | 4/2022 | Anuar et al. |
| 11,334,388 B2 | 5/2022 | Jakobsson |
| 11,336,096 B2 | 5/2022 | Jakobsson et al. |
| 11,336,199 B2 | 5/2022 | Telefus et al. |
| 11,342,151 B2 | 5/2022 | Telefus et al. |
| 11,342,735 B2 | 5/2022 | Telefus et al. |
| 11,348,752 B2 | 5/2022 | Telefus et al. |
| 11,349,296 B2 | 5/2022 | Telefus |
| 11,349,297 B2 | 5/2022 | Telefus et al. |
| 11,363,690 B2 | 6/2022 | Telefus et al. |
| 11,373,831 B2 | 6/2022 | Telefus et al. |
| 11,422,520 B2 | 8/2022 | Telefus et al. |
| 11,463,274 B2 | 10/2022 | Jakobsson |
| 11,477,209 B2 | 10/2022 | Jakobsson |
| 2002/0109487 A1 | 8/2002 | Telefus et al. |
| 2003/0052544 A1 | 3/2003 | Yamamoto et al. |
| 2003/0063420 A1 | 4/2003 | Pahl et al. |
| 2003/0151865 A1 | 8/2003 | Maio |
| 2004/0032756 A1 | 2/2004 | Van Den Bossche |
| 2004/0251884 A1 | 12/2004 | Steffie et al. |
| 2005/0128657 A1 | 6/2005 | Covault |
| 2005/0162139 A1 | 7/2005 | Hirst |
| 2005/0185353 A1 | 8/2005 | Rasmussen et al. |
| 2005/0286184 A1 | 12/2005 | Campolo |
| 2006/0285366 A1 | 12/2006 | Radecker et al. |
| 2007/0008747 A1 | 1/2007 | Soldano et al. |
| 2007/0018506 A1 | 1/2007 | Paik et al. |
| 2007/0143826 A1 | 6/2007 | Sastry et al. |
| 2007/0159745 A1 | 7/2007 | Berberich et al. |
| 2007/0188025 A1* | 8/2007 | Keagy ............... H05B 39/086 307/115 |
| 2007/0217237 A1 | 9/2007 | Palestrina |
| 2007/0232347 A1 | 10/2007 | Persson et al. |
| 2007/0236152 A1 | 10/2007 | Davis et al. |
| 2008/0006607 A1 | 1/2008 | Boeder et al. |
| 2008/0136581 A1 | 6/2008 | Heilman et al. |
| 2008/0151444 A1 | 6/2008 | Upton |
| 2008/0174922 A1 | 7/2008 | Kimbrough |
| 2008/0180866 A1 | 7/2008 | Wong |
| 2008/0197699 A1 | 8/2008 | Yu et al. |
| 2008/0204950 A1 | 8/2008 | Zhou et al. |
| 2008/0234879 A1 | 9/2008 | Fuller et al. |
| 2008/0246451 A1 | 10/2008 | Dobbins et al. |
| 2008/0253153 A1 | 10/2008 | Wu et al. |
| 2008/0281472 A1 | 11/2008 | Podgorny et al. |
| 2009/0034139 A1 | 2/2009 | Martin |
| 2009/0067201 A1 | 3/2009 | Cai |
| 2009/0168273 A1 | 7/2009 | Yu et al. |
| 2009/0195349 A1 | 8/2009 | Frader-Thompson et al. |
| 2009/0203355 A1 | 8/2009 | Clark |
| 2009/0213629 A1 | 8/2009 | Liu et al. |
| 2009/0284385 A1 | 11/2009 | Tang et al. |
| 2010/0036903 A1 | 2/2010 | Ahmad et al. |
| 2010/0091418 A1 | 4/2010 | Xu |
| 2010/0145479 A1 | 6/2010 | Griffiths |
| 2010/0145542 A1 | 6/2010 | Chapel et al. |
| 2010/0156369 A1 | 6/2010 | Kularatna et al. |
| 2010/0176661 A1* | 7/2010 | Wilson ............... H05B 47/185 307/114 |
| 2010/0188054 A1 | 7/2010 | Asakura et al. |
| 2010/0191487 A1 | 7/2010 | Rada et al. |
| 2010/0231135 A1 | 9/2010 | Hum et al. |
| 2010/0231373 A1 | 9/2010 | Romp |
| 2010/0235896 A1 | 9/2010 | Hirsch |
| 2010/0244730 A1 | 9/2010 | Nerone |
| 2010/0261373 A1 | 10/2010 | Roneker |
| 2010/0284207 A1 | 11/2010 | Watanabe et al. |
| 2010/0296207 A1 | 11/2010 | Schumacher et al. |
| 2010/0309003 A1 | 12/2010 | Rousseau |
| 2010/0320840 A1 | 12/2010 | Fridberg |
| 2011/0062936 A1 | 3/2011 | Bartelous |
| 2011/0121752 A1 | 5/2011 | Newman, Jr. et al. |
| 2011/0127922 A1 | 6/2011 | Sauerlaender |
| 2011/0156610 A1 | 6/2011 | Ostrovsky et al. |
| 2011/0273103 A1 | 11/2011 | Hong |
| 2011/0292703 A1 | 12/2011 | Cuk |
| 2011/0299547 A1 | 12/2011 | Diab et al. |
| 2011/0301894 A1 | 12/2011 | Sanderford, Jr. |
| 2011/0305054 A1 | 12/2011 | Yamagiwa et al. |
| 2011/0307447 A1 | 12/2011 | Sabaa et al. |
| 2012/0026632 A1 | 2/2012 | Acharya et al. |
| 2012/0075897 A1 | 3/2012 | Fujita |
| 2012/0080942 A1 | 4/2012 | Carralero et al. |
| 2012/0089266 A1 | 4/2012 | Tomimbang et al. |
| 2012/0095605 A1 | 4/2012 | Tran |
| 2012/0133289 A1 | 5/2012 | Hum et al. |
| 2012/0190386 A1 | 7/2012 | Anderson |
| 2012/0275076 A1 | 11/2012 | Shono |
| 2012/0311035 A1 | 12/2012 | Guha et al. |
| 2012/0323510 A1 | 12/2012 | Bell et al. |
| 2013/0026925 A1 | 1/2013 | Ven et al. |
| 2013/0051102 A1 | 2/2013 | Huang et al. |
| 2013/0057247 A1 | 3/2013 | Russell et al. |
| 2013/0063851 A1 | 3/2013 | Stevens et al. |
| 2013/0066478 A1 | 3/2013 | Smith |
| 2013/0088160 A1 | 4/2013 | Chai et al. |
| 2013/0104238 A1 | 4/2013 | Balsan et al. |
| 2013/0119958 A1 | 5/2013 | Gasperi |
| 2013/0128396 A1 | 5/2013 | Danesh et al. |
| 2013/0170261 A1 | 7/2013 | Lee et al. |
| 2013/0174211 A1 | 7/2013 | Aad et al. |
| 2013/0187631 A1 | 7/2013 | Russell et al. |
| 2013/0245841 A1 | 9/2013 | Ahn et al. |
| 2013/0253898 A1 | 9/2013 | Meagher et al. |
| 2013/0261821 A1 | 10/2013 | Lu et al. |
| 2013/0265041 A1 | 10/2013 | Friedrich et al. |
| 2013/0300534 A1 | 11/2013 | Myllymaki |
| 2013/0329331 A1 | 12/2013 | Erger et al. |
| 2014/0043732 A1 | 2/2014 | McKay et al. |
| 2014/0067137 A1 | 3/2014 | Amelio et al. |
| 2014/0074730 A1 | 3/2014 | Arensmeier et al. |
| 2014/0085940 A1 | 3/2014 | Lee et al. |
| 2014/0096272 A1 | 4/2014 | Makofsky et al. |
| 2014/0097809 A1 | 4/2014 | Follic et al. |
| 2014/0159593 A1 | 6/2014 | Chu et al. |
| 2014/0164294 A1 | 6/2014 | Osann, Jr. |
| 2014/0203718 A1 | 7/2014 | Yoon et al. |
| 2014/0246926 A1 | 9/2014 | Cruz et al. |
| 2014/0266698 A1 | 9/2014 | Hall et al. |
| 2014/0268935 A1 | 9/2014 | Chiang |
| 2014/0276753 A1 | 9/2014 | Wham et al. |
| 2014/0331278 A1 | 11/2014 | Tkachev |
| 2014/0357228 A1 | 12/2014 | Luft et al. |
| 2014/0365490 A1 | 12/2014 | Yang et al. |
| 2015/0019726 A1 | 1/2015 | Zhou et al. |
| 2015/0042274 A1 | 2/2015 | Kim et al. |
| 2015/0055261 A1 | 2/2015 | Lubicki et al. |
| 2015/0097430 A1 | 4/2015 | Scruggs |
| 2015/0116886 A1 | 4/2015 | Zehnder et al. |
| 2015/0154404 A1 | 6/2015 | Patel et al. |
| 2015/0155789 A1 | 6/2015 | Freeman et al. |
| 2015/0180469 A1 | 6/2015 | Kim |
| 2015/0185261 A1 | 7/2015 | Frader-Thompson et al. |
| 2015/0185262 A1 | 7/2015 | Song et al. |
| 2015/0216006 A1 | 7/2015 | Lee et al. |
| 2015/0221151 A1 | 8/2015 | Bacco et al. |
| 2015/0236587 A1 | 8/2015 | Kim et al. |
| 2015/0253364 A1 | 9/2015 | Hieda et al. |
| 2015/0256355 A1 | 9/2015 | Pera et al. |

(56) References Cited

U.S. PATENT DOCUMENTS

| | | |
|---|---|---|
| 2015/0256665 A1 | 9/2015 | Pera et al. |
| 2015/0282223 A1 | 10/2015 | Wang et al. |
| 2015/0309521 A1 | 10/2015 | Pan |
| 2015/0317326 A1 | 11/2015 | Bandarupalli et al. |
| 2015/0355649 A1 | 12/2015 | Ovadia |
| 2015/0362927 A1 | 12/2015 | Giorgi |
| 2015/0363563 A1 | 12/2015 | Hallwachs |
| 2015/0382153 A1 | 12/2015 | Otis et al. |
| 2016/0012699 A1 | 1/2016 | Lundy |
| 2016/0018800 A1 | 1/2016 | Gettings et al. |
| 2016/0035159 A1 | 2/2016 | Ganapathy Achari et al. |
| 2016/0050530 A1 | 2/2016 | Corbalis et al. |
| 2016/0057841 A1 | 2/2016 | Lenig |
| 2016/0069933 A1 | 3/2016 | Cook et al. |
| 2016/0077746 A1 | 3/2016 | Muth et al. |
| 2016/0081143 A1 | 3/2016 | Wang |
| 2016/0095099 A1 | 3/2016 | Yang et al. |
| 2016/0105814 A1 | 4/2016 | Hurst et al. |
| 2016/0110154 A1 | 4/2016 | Qureshi et al. |
| 2016/0117917 A1 | 4/2016 | Prakash et al. |
| 2016/0126031 A1 | 5/2016 | Wootton et al. |
| 2016/0156635 A1 | 6/2016 | Liu et al. |
| 2016/0157193 A1 | 6/2016 | Qi et al. |
| 2016/0178691 A1 | 6/2016 | Simonin |
| 2016/0181941 A1 | 6/2016 | Gratton et al. |
| 2016/0195864 A1 | 7/2016 | Kim |
| 2016/0232318 A1 | 8/2016 | Mensinger et al. |
| 2016/0247799 A1 | 8/2016 | Stafanov et al. |
| 2016/0259308 A1 | 9/2016 | Fadell et al. |
| 2016/0260135 A1 | 9/2016 | Zomet et al. |
| 2016/0274864 A1 | 9/2016 | Zomet et al. |
| 2016/0277528 A1 | 9/2016 | Guilaume et al. |
| 2016/0294179 A1 | 10/2016 | Kennedy et al. |
| 2016/0343083 A1 | 11/2016 | Hering et al. |
| 2016/0360586 A1 | 12/2016 | Yang et al. |
| 2016/0374134 A1 | 12/2016 | Kweon et al. |
| 2017/0004948 A1 | 1/2017 | Leyh |
| 2017/0019969 A1 | 1/2017 | O'Neil et al. |
| 2017/0026194 A1 | 1/2017 | Vijayrao et al. |
| 2017/0033942 A1 | 2/2017 | Koeninger |
| 2017/0063225 A1 | 3/2017 | Guo et al. |
| 2017/0067961 A1 | 3/2017 | O'Flynn |
| 2017/0086281 A1 | 3/2017 | Avrahamy |
| 2017/0099647 A1 | 4/2017 | Shah et al. |
| 2017/0104325 A1 | 4/2017 | Eriksen et al. |
| 2017/0134883 A1 | 5/2017 | Lekutai |
| 2017/0168516 A1 | 6/2017 | King |
| 2017/0170730 A1 | 6/2017 | Sugiura |
| 2017/0171802 A1 | 6/2017 | Hou et al. |
| 2017/0179946 A1 | 6/2017 | Turvey |
| 2017/0195130 A1 | 7/2017 | Landow et al. |
| 2017/0212653 A1 | 7/2017 | Kanojia et al. |
| 2017/0214967 A1 | 7/2017 | Xia et al. |
| 2017/0230193 A1 | 8/2017 | Apte et al. |
| 2017/0230939 A1 | 8/2017 | Rudolf et al. |
| 2017/0244241 A1 | 8/2017 | Wilson et al. |
| 2017/0251014 A1 | 8/2017 | Eisen |
| 2017/0256934 A1 | 9/2017 | Kennedy et al. |
| 2017/0256941 A1 | 9/2017 | Bowers et al. |
| 2017/0256956 A1 | 9/2017 | Irish et al. |
| 2017/0265287 A1 | 9/2017 | Avrahamy |
| 2017/0277709 A1 | 9/2017 | Strauss et al. |
| 2017/0314743 A1 | 11/2017 | Del Castillo et al. |
| 2017/0318098 A1 | 11/2017 | Sanghvi et al. |
| 2017/0322049 A1 | 11/2017 | Wootton et al. |
| 2017/0322258 A1 | 11/2017 | Miller et al. |
| 2017/0338809 A1 | 11/2017 | Stefanov et al. |
| 2017/0347415 A1 | 11/2017 | Cho et al. |
| 2017/0366950 A1 | 12/2017 | Arbon |
| 2017/0372159 A1 | 12/2017 | Schimmel |
| 2018/0026534 A1 | 1/2018 | Turcan |
| 2018/0054460 A1 | 2/2018 | Brady et al. |
| 2018/0054862 A1 | 2/2018 | Takagimoto et al. |
| 2018/0061158 A1 | 3/2018 | Greene |
| 2018/0091361 A1 | 3/2018 | Smith et al. |
| 2018/0146369 A1 | 5/2018 | Kennedy, Jr. |
| 2018/0174076 A1 | 6/2018 | Fukami |
| 2018/0183685 A1 | 6/2018 | Cook |
| 2018/0196094 A1 | 7/2018 | Fishburn et al. |
| 2018/0201302 A1 | 7/2018 | Sonoda et al. |
| 2018/0254959 A1 | 9/2018 | Mantyjarvi et al. |
| 2018/0285198 A1 | 10/2018 | Dantkale et al. |
| 2018/0287802 A1 | 10/2018 | Brickell |
| 2018/0301006 A1 | 10/2018 | Flint et al. |
| 2018/0307609 A1 | 10/2018 | Qiang et al. |
| 2018/0307859 A1 | 10/2018 | LaFever et al. |
| 2018/0342329 A1 | 11/2018 | Rufo et al. |
| 2018/0351342 A1 | 12/2018 | Anderson et al. |
| 2018/0359039 A1 | 12/2018 | Daoura et al. |
| 2018/0359223 A1 | 12/2018 | Maier et al. |
| 2019/0003855 A1 | 1/2019 | Wootton et al. |
| 2019/0020477 A1 | 1/2019 | Antonatos et al. |
| 2019/0026493 A1 | 1/2019 | Ukena-Bonfig et al. |
| 2019/0028869 A1 | 1/2019 | Kaliner |
| 2019/0036928 A1 | 1/2019 | Meriac et al. |
| 2019/0050903 A1 | 2/2019 | DeWitt et al. |
| 2019/0052174 A1 | 2/2019 | Gong |
| 2019/0068716 A1 | 2/2019 | Lauer |
| 2019/0086979 A1 | 3/2019 | Kao et al. |
| 2019/0087835 A1 | 3/2019 | Schwed et al. |
| 2019/0104138 A1 | 4/2019 | Storms et al. |
| 2019/0122834 A1 | 4/2019 | Wootton et al. |
| 2019/0140640 A1 | 5/2019 | Telefus et al. |
| 2019/0148931 A1 | 5/2019 | Li |
| 2019/0165691 A1 | 5/2019 | Telefus et al. |
| 2019/0181679 A1 | 6/2019 | Northway et al. |
| 2019/0182617 A1 | 6/2019 | Zamber et al. |
| 2019/0207375 A1 | 7/2019 | Telefus et al. |
| 2019/0222058 A1 | 7/2019 | Sharifipour |
| 2019/0238060 A1 | 8/2019 | Telefus et al. |
| 2019/0245457 A1 | 8/2019 | Telefus et al. |
| 2019/0253243 A1 | 8/2019 | Zimmerman et al. |
| 2019/0268176 A1 | 8/2019 | Pognant |
| 2019/0280887 A1 | 9/2019 | Telefus et al. |
| 2019/0306953 A1 | 10/2019 | Joyce et al. |
| 2019/0334999 A1 | 10/2019 | Ryhorchuk et al. |
| 2019/0355014 A1 | 11/2019 | Gerber |
| 2019/0362101 A1 | 11/2019 | Fisse et al. |
| 2019/0372331 A1 | 12/2019 | Liu et al. |
| 2020/0007126 A1 | 1/2020 | Telefus et al. |
| 2020/0014301 A1 | 1/2020 | Telefus |
| 2020/0014379 A1 | 1/2020 | Telefus |
| 2020/0044883 A1 | 2/2020 | Telefus et al. |
| 2020/0052607 A1 | 2/2020 | Telefus et al. |
| 2020/0053100 A1 | 2/2020 | Jakobsson |
| 2020/0106259 A1 | 4/2020 | Telefus |
| 2020/0106260 A1 | 4/2020 | Telefus |
| 2020/0106637 A1 | 4/2020 | Jakobsson |
| 2020/0120202 A1 | 4/2020 | Jakobsson et al. |
| 2020/0145247 A1 | 5/2020 | Jakobsson |
| 2020/0153245 A1 | 5/2020 | Jakobsson et al. |
| 2020/0159960 A1 | 5/2020 | Jakobsson |
| 2020/0193785 A1 | 6/2020 | Berglund et al. |
| 2020/0196110 A1 | 6/2020 | Jakobsson |
| 2020/0196412 A1 | 6/2020 | Telefus et al. |
| 2020/0200851 A1 | 6/2020 | Homsky et al. |
| 2020/0252299 A1 | 8/2020 | Kaag et al. |
| 2020/0260287 A1 | 8/2020 | Hendel |
| 2020/0275266 A1 | 8/2020 | Jakobsson |
| 2020/0287537 A1 | 9/2020 | Telefus et al. |
| 2020/0314233 A1 | 10/2020 | Mohalik et al. |
| 2020/0328694 A1 | 10/2020 | Telefus et al. |
| 2020/0344596 A1 | 10/2020 | Dong et al. |
| 2020/0365345 A1 | 11/2020 | Telefus et al. |
| 2020/0365346 A1 | 11/2020 | Telefus et al. |
| 2020/0365356 A1 | 11/2020 | Telefus et al. |
| 2020/0366078 A1 | 11/2020 | Telefus et al. |
| 2020/0366079 A1 | 11/2020 | Telefus et al. |
| 2020/0394332 A1 | 12/2020 | Jakobsson et al. |
| 2021/0014947 A1 | 1/2021 | Telefus et al. |
| 2021/0119528 A1 | 4/2021 | Telefus |
| 2021/0173364 A1 | 6/2021 | Telefus et al. |
| 2021/0182111 A1 | 6/2021 | Jakobsson |
| 2021/0185035 A1 | 6/2021 | Fernandez Yu |

(56) References Cited

U.S. PATENT DOCUMENTS

| | | |
|---|---|---|
| 2021/0226441 A1 | 7/2021 | Telefus et al. |
| 2021/0234356 A1 | 7/2021 | Telefus et al. |
| 2021/0336555 A1 | 10/2021 | Telefus |
| 2021/0345462 A1 | 11/2021 | Telefus et al. |
| 2022/0052533 A1 | 2/2022 | Telefus et al. |
| 2022/0189721 A1 | 6/2022 | Telefus et al. |
| 2022/0255310 A1 | 8/2022 | Telefus |
| 2022/0311350 A1 | 9/2022 | Telefus |

FOREIGN PATENT DOCUMENTS

| | | |
|---|---|---|
| DE | 19712261 A1 | 10/1998 |
| EP | 0016646 A1 | 10/1980 |
| EP | 0398026 A2 | 11/1990 |
| EP | 2560063 A1 | 2/2013 |
| GB | 1302357 A | 1/1973 |
| GB | 2458699 A | 9/2009 |
| JP | 06-053779 A | 2/1994 |
| JP | 2012244716 A | 12/2012 |
| JP | 2013230034 A | 11/2013 |
| JP | 2014030355 A | 2/2014 |
| JP | 6997105 B2 | 1/2022 |
| WO | 2010110951 A1 | 9/2010 |
| WO | 2016010529 A1 | 1/2016 |
| WO | 2016105505 A1 | 6/2016 |
| WO | 2016110833 A2 | 7/2016 |
| WO | 2017196571 A1 | 11/2017 |
| WO | 2017196572 A1 | 11/2017 |
| WO | 2017196649 A1 | 11/2017 |
| WO | 2018075726 A1 | 4/2018 |
| WO | 2018080604 A1 | 5/2018 |
| WO | 2018080614 A1 | 5/2018 |
| WO | 2018081619 A2 | 5/2018 |
| WO | 2018081619 A3 | 5/2018 |
| WO | 2018159914 A1 | 9/2018 |
| WO | 2019133110 A1 | 7/2019 |
| WO | 2020014158 A1 | 1/2020 |
| WO | 2020014161 A1 | 1/2020 |
| WO | PCT/US19/54102 | 2/2020 |
| WO | 2020072516 A1 | 4/2020 |
| WO | PCT/US19/67004 | 4/2020 |
| WO | 2020131977 A1 | 6/2020 |
| WO | PCT/US20/33421 | 9/2020 |
| WO | 2020236726 A1 | 11/2020 |
| WO | PCT/US21/14320 | 4/2021 |
| WO | 2021112870 A1 | 6/2021 |
| WO | 2021150684 A1 | 7/2021 |
| WO | 2021183172 A1 | 9/2021 |
| WO | PCT/US21/45624 | 11/2021 |

OTHER PUBLICATIONS

U.S. Appl. No. 17/904,437 filed in the name of Mark Telefus on Aug. 17, 2022, and entitled "AC to DC Converter.".

U.S. Appl. No. 17/930,597 filed in the name of Mark Telefus and entitled "AC to DC Converter on a Chip."

U.S. Appl. No. 63/270,728 filed in the name of Mark Telefus et al. on Oct. 22, 2021, and entitled "Multi-Output Programmable Power Manager."

U.S. Appl. No. 63/303,492 filed in the name of Damon Matthew Baker et al. on Jan. 26, 2022, and entitled "Zero-Current Crossing Detection In Inductive Loads."

U.S. Appl. No. 63/356,317 filed in the name of Mark Telefus et al. on Jun. 28, 2022, and entitled "FET-Based AC-to-DC Converter with Negative Cycle Gate Pre-Charge."

U.S. Appl. No. 63/402,058 filed in the name of Mark Telefus et al. on Aug. 29, 2022, and entitled "Thermal-Mechanical Framework for Solid-State Circuit Breaker."

F. Stajano et al., "The Resurrecting Duckling: Security Issues for Ad-hoc Wireless Networks," International Workshop on Security Protocols, 1999, 11 pages.

L. Sweeney, "Simple Demographics Often Identify People Uniquely," Carnegie Mellon University, Data Privacy Working Paper 3, 2000, 34 pages.

A. Narayanan et al., "Robust De-anonymization of Large Sparse Datasets," IEEE Symposium on Security and Privacy, May 2008, 15 pages.

M. Alahmad et al., "Non-Intrusive Electrical Load Monitoring and Profiling Methods for Applications in Energy Management Systems," IEEE Long Island Systems, Applications and Technology Conference, 2011, 7 pages.

K. Yang et al. "Series Arc Fault Detection Algorithm Based on Autoregressive Bispecturm Analysis," Algorithms, vol. 8, Oct. 16, 2015, pp. 929-950.

J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.

S. Cuk, "98% Efficient Single-Stage AC/DC Converter Topologies," Power Electronics Europe, Issue 4, 2011, 6 pages.

E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.

C. Restrepo, "Arc Fault Detection and Discrimination Methods," 2007 Proceedings of the 53rd IEEE Holm Conference on Electrical Contacts, IEEE Explore Sep. 24, 2007, 8 pages.

K. Eguchi et al., "Design of a Charge-Pump Type AC-DC Converter for RF-ID Tags," 2006 International Symposium on Communications and Information Technologies, F4D-3, IEEE, 2006, 4 pages.

A. Ayari et al., "Active Power Measurement Comparison Between Analog and Digital Methods," International Conference on Electrical Engineering and Software Applications, 2013, 6 pages.

G. D. Gregory et al., "The Arc-Fault Circuit Interrupter, an Emerging Product," IEEE, 1998, 8 pages.

D. Irwin et al., "Exploiting Home Automation Protocols for Load Monitoring in Smart Buildings," BuildSys '11: Proceedings of the Third ACM Workshop on Embedded Sensing Systems for Energy-Efficiency in Buildings, Nov. 2011, 6 pages.

B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.

J. K. Becker et al., "Tracking Anonymized Bluetooth Devices," Proceedings on Privacy Enhancing Technologies, vol. 3, 2019, pp. 50-65.

H. Siadati et al., "Mind your SMSes: Mitigating Social Engineering in Second Factor Authentication," Computers & Security, vol. 65, Mar. 2017, 12 pages.

S. Jerde, "The New York Times Can Now Predict Your Emotions and Motivations After Reading a Story," https://www.adweek.com/tv-video/the-new-york-times-can-now-predict-your-emotions-and-motivations-after-reading-a-story/, Apr. 29, 2019, 3 pages.

K. Mowery et al., "Pixel Perfect: Fingerprinting Canvas in HTML5," Proceedings of W2SP, 2012, 12 pages.

S. Kamkar, "Evercookie," https://samy.pl/evercookie/, Oct. 11, 2010, 5 pages.

M. K. Franklin et al., "Fair Exchange with a Semi-Trusted Third Party," Association for Computing Machinery, 1997, 6 pages.

J. Camenisch et al., "Digital Payment Systems with Passive Anonymity-Revoking Trustees," Journal of Computer Security, vol. 5, No. 1, 1997, 11 pages.

L. Coney et al., "Towards a Privacy Measurement Criterion for Voting Systems," Proceedings of the 2005 National Conference on Digital Government Research, 2005, 2 pages.

L. Sweeney, "k-anonymity: A Model for Protecting Privacy," International Journal of Uncertainty, Fuzziness and Knowledge-Based Systems, vol. 1, No. 5, 2002, 14 pages.

C. Dwork, "Differential Privacy," Encyclopedia of Cryptography and Security, 2011, 12 pages.

A. P. Felt et al., "Android Permissions: User Attention, Comprehension, and Behavior," Symposium on Usable Privacy and Security, Jul. 11-13, 2012, 14 pages.

S. Von Solms et al., "On Blind Signatures and Perfect Crimes," Computers & Security, vol. 11, No. 6, 1992, 3 pages.

(56) References Cited

OTHER PUBLICATIONS

R. Wyden, "Wyden Releases Discussion Draft of Legislation to Provide Real Protections for Americans' Privacy," https://www.wyden.senate.gov/news/press-releases/wyden-releases-discussion-draft-of-legislation-to-provide-real-protections-for-americans-privacy, Nov. 1, 2018, 3 pages.

M. Rubio, "Rubio Introduces Privacy Bill to Protect Consumers While Promoting Innovation," https://www.rubio.senate.gov/public/index.cfm/2019/1/rubio-introduces-privacy-bill-to-protect-consumers-while-promoting-innovation#:%7E:text=Washingt%E2%80%A6, Jan. 16, 2019, 2 pages.

C. Dwork et al., "Differential Privacy and Robust Statistics," 41st ACM Symposium on Theory of Computing, 2009, 10 pages.

J. Camenisch et al., "Compact E-Cash," Eurocrypt, vol. 3494, 2005, pp. 302-321.

D. L. Chaum, "Untraceable Electronic Mail, Return Addresses, and Digital Pseudonyms," Communications of the ACM, vol. 24, No. 2, Feb. 1981, pp. 84-88.

J. Camenisch et al., "An Efficient System For Nontransferable Anonymous Credentials With Optional Anonymity Revocation," International Conference on the Theory and Application of Cryptographic Techniques, May 6-10, 2001, 30 pages.

M. K. Reiter et al., "Crowds: Anonymity For Web Transactions," ACM Transactions on Information and System Security, vol. 1, 1997, 23 pages.

I. Clarke et al., "Freenet: A Distributed Anonymous Information Storage and Retrieval System," International Workshop on Designing Privacy Enhanching Technologies: Design Issues in Anonymity and Unobservability, 2001, 21 pages.

P. Golle et al., "Universal Re-encryption for Mixnets," Lecture Notes in Computer Science, Feb. 2004, 15 pages.

Y. Lindell et al., "Multiparty Computation for Privacy Preserving Data Mining," Journal of Privacy and Confidentiality, May 6, 2008, 39 pages.

J. Hollan et al., "Distributed Cognition: Toward a New Foundation for Human-Computer Interaction Research," ACM Transactions on Computer-Human Interaction, vol. 7, No. 2, Jun. 2000, pp. 174-196.

A. Adams et al., "Users are Not the Enemy," Communications of the ACM, Dec. 1999, 6 pages.

A. Morton et al., "Privacy is a Process, Not a Pet: a Theory for Effective Privacy Practice," Proceedings of the 2012 New Security Paradigms Workshop, Sep. 2012, 18 pages.

G. D. Abowd et al., "Charting Past, Present and Future Research in Ubiquitous Computing," ACM Transactions on Computer-Human Interaction, vol. 7, No. 1, Mar. 2000, pp. 29-58.

W. Mason et al., "Conducting Behavioral Research on Amazon's Mechanical Turk," Behavior Research Methods, Jun. 2011, 23 pages.

G. M. Gray et al., "Dealing with the Dangers of Fear: The Role of Risk Communication," Health Affairs, Nov. 2002, 11 pages.

L. Shengyuan et al., "Instantaneous Value Sampling AC-DC Converter and its Application in Power Quantity Detection," 2011 Third International Conference on Measuring Technology and Mechatronics Automation, Jan. 6-7, 2011, 4 pages.

H.-H. Chang et al., "Load Recognition for Different Loads with the Same Real Power and Reactive Power in a Non-intrusive Load-monitoring System," 2008 12th International Conference on Computer Supported Cooperative Work in Design, Apr. 16-18, 2008, 6 pages.

\* cited by examiner

200

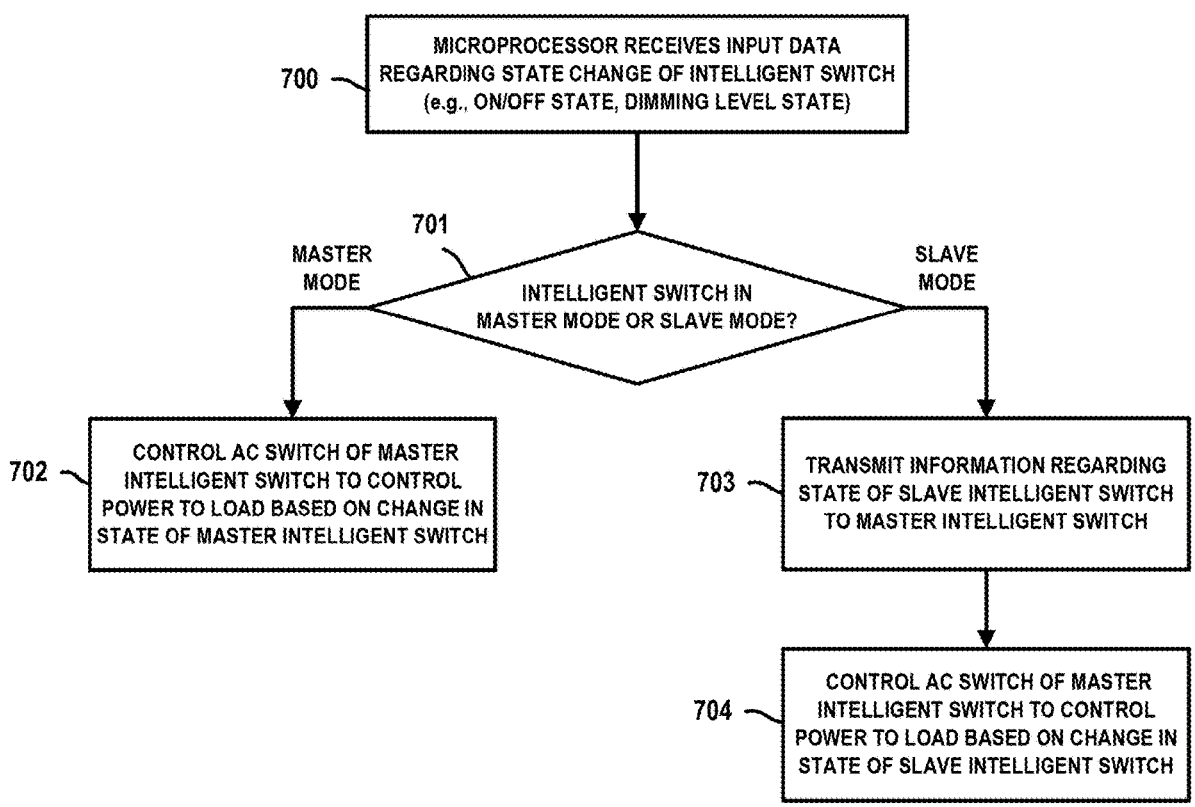

INTELLIGENT ELECTRICAL SWITCHES

CROSS-REFERENCE TO RELATED APPLICATION

This application claims the benefit of U.S. Provisional Application Ser. No. 63/250,716, filed on Sep. 30, 2021, the disclosure of which is fully incorporated herein by reference.

BACKGROUND

This disclosure relates generally to electrical switches for implementing multi-way switching. In a multi-way switching circuit, two or more electrical switches are configured and wired to control power to a given load from different locations. For example, a common application for multi-way switching is to control lighting in a building or residence, wherein a multi-way switch circuit having two or more multi-way switches allows a person to control lighting from multiple locations, for example in a hallway, stairwell, or large room. However, conventional multi-way circuits and switch devices do not allow for, e.g., controlling light dimming from multiple locations.

BRIEF DESCRIPTION OF THE DRAWINGS

FIG. 7 illustrates a flow diagram of a process for controlling power delivered to a load based on a change in state of an intelligent electrical switch operating in a master mode or slave mode, according to an exemplary embodiment of the disclosure.

DETAILED DESCRIPTION OF EXEMPLARY EMBODIMENTS

Exemplary embodiments of the disclosure will now be described in further detail with regard to intelligent electrical switches and multi-way circuits that are implemented using two or more intelligent electrical switches for controlling power to a load (e.g., lighting). As explained in further detail below, exemplary embodiments of the disclosure comprise intelligent switches that are configured to replace existing conventional electrical switch devices that are wired for multi-way switching (e.g., three-way switching, four-way switching, etc.).

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Figure 1A:
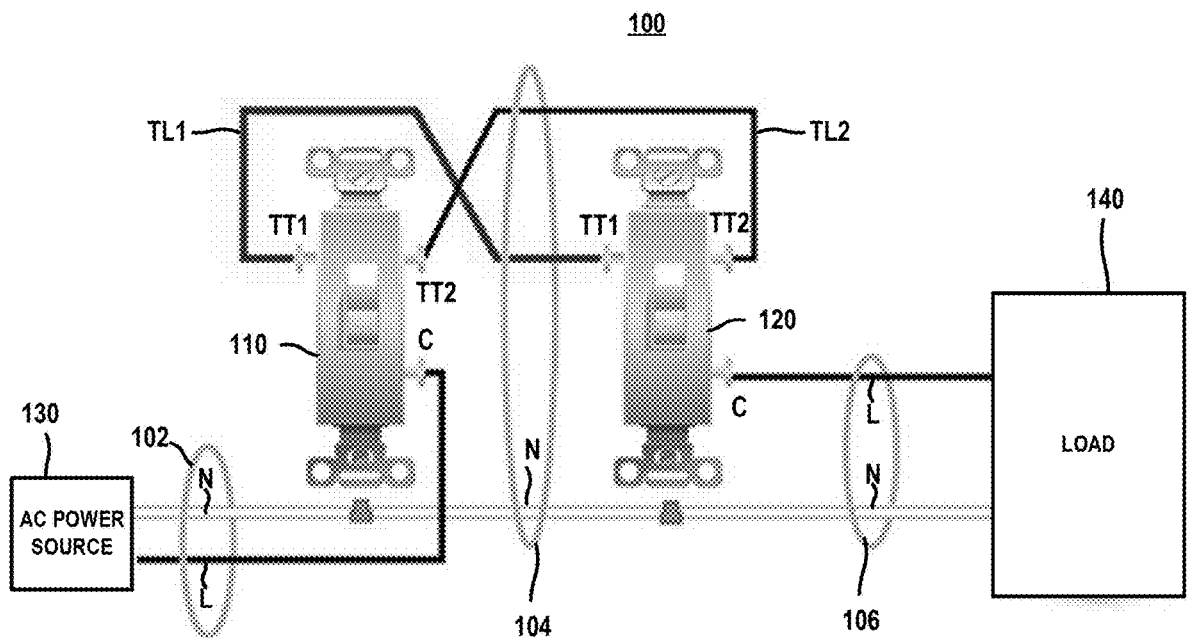
FIGS. 1A and 1B illustrate a conventional multi-way circuit that is implemented using single pole double throw (SPDT) switches.
Figure 1B:
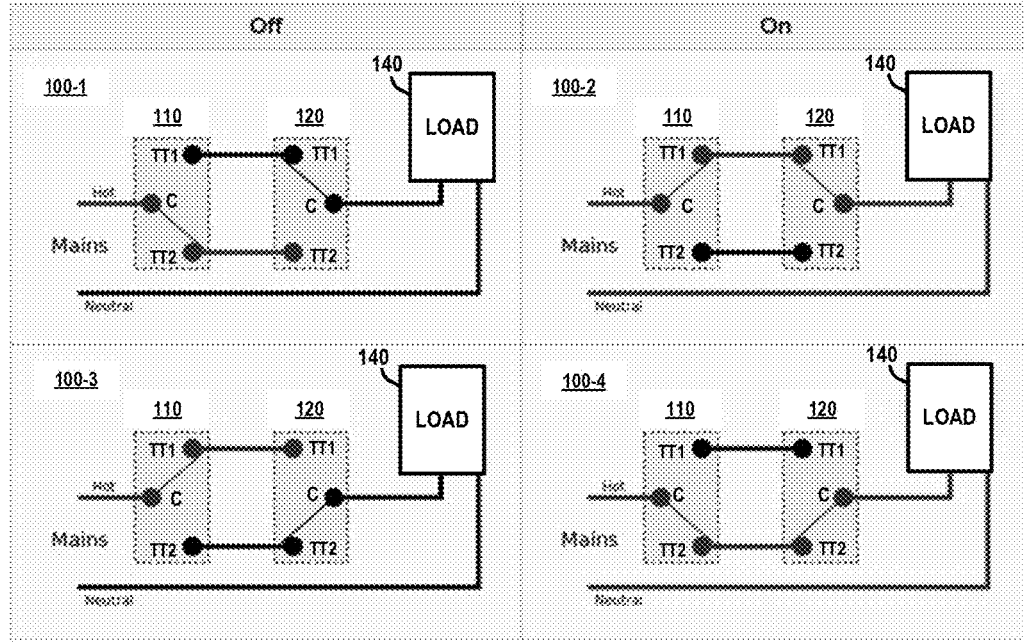

FIGS. 1A and 1B illustrate a conventional multi-way circuit that is implemented using single pole double throw (SPDT) switches. In particular, FIG. 1A illustrate a conventional multi-way circuit 100 comprising a first SPDT electrical switch 110 and a second SPDT electrical switch 120 which are configured to control AC power that is delivered from an AC power source 130 (e.g., AC mains) to a load 140 (e.g., lighting). The first and second SPDT electrical switches 110 and 120 each comprise what is referred to as a 3-way electrical switch, wherein the first and second SPDT electrical switches 110 and 120 can be wired (as shown in FIG. 1A) control the load 140 from different locations such as opposite ends of a stairway or a long hallway. The load 140 can be one or more light fixtures, but other loads could be controlled in this manner.

The first and second SPDT electrical switches 110 and 120 each comprise a common terminal C, a first traveler terminal TT1, and a second traveler terminal TT2. In the wiring configuration shown in FIG. 1A, the first SPDT electrical switch 110 is coupled to the AC power source 130 through a circuit breaker using a standard 2-wire cable 102 having a hot wire L (e.g., black wire), a neutral wire N (e.g., white wire), and a ground wire (bare copper wire not shown). The first SPDT electrical switch 110 is connected to the second SPDT electrical switch 120 using a standard three-wire cable 104 comprising a first traveler wire line TL1 (e.g., black wire), a second traveler wire TL2 (e.g., red wire), a neutral wire N (white wire), and a ground wire (bare copper wire not shown). The second SPDT electrical switch 120 is connected to the load 140 using a standard 2-wire cable 106 having a hot wire L (e.g., black wire) and neutral wire N (e.g., white wire), and a ground wire (bare copper wire not shown). As is known in the art, the neural wire is also referenced to as a "grounded conductor" as the neutral wire provides a return path to complete an AC 120V circuit.

As further shown in FIG. 1A, the neutral wires N of the two-wire cable 102 and the three-wire cable 104 are spliced together in, e.g., a first gang box (not shown) in which the first SPDT electrical switch 110 is disposed, and the neutral wires N of the three-wire cable 104 and the two-wire cable 106 are spliced together in, e.g., a second gang box (not shown) in which the second SPDT electrical switch 120 is disposed. In this wiring configuration, the AC power source neutral wire (grounded conductor line) is essentially connected directly to the load 140. In addition, the hot (line) wire L of the two-wire cable 102 is connected to the common terminal C of the first SPDT electrical switch 110, the hot (line) wire L of the two-wire cable 106 is connected to the common terminal C of the second SPDT electrical switch 120. Further, the first traveler terminals TT1 of the first and second SPDT electrical switches 110 and 120 are connected together by the first traveler wire TL1, and the second traveler terminals TT2 of the first and second SPDT electrical switches 110 and 120 are connected together by the second traveler wire TL2. With this exemplary wiring configuration, the first and second SPDT electrical switches 110 and 120 (with two positions each) provides 4 (four) possible switch states that enable a user to control the load 140 from either first and second SPDT electrical switches 110 and 120 in all cases.

For example, FIG. 1B schematically illustrates four possible switch states for the multi-way circuit (or 3-way circuit) provided by the first and second SPDT electrical switches 110 and 120. As schematically illustrated in FIG. 1B, the first and second SPDT electrical switches 110 and 120 each comprise a single input (common C terminal) and two outputs (first and second traveler terminals TT1 and TT2). FIG. 1B shows four switch states 100-1, 100-2, 100-3, and 100-4. In the switch states 100-1 and 100-3, the first and second SPDT electrical switches 110 and 120 are in different switch positions and the power to the low 140 is "Off". In the switch states 100-2 and 100-4, when first and second SPDT electrical switches 110 and 120 are in the same switch position, the power to the load 140 is "On". Using combinational logic terminology, the switch states shown in FIG. 1 provide Exclusive NOR (XNOR) functionality. By swapping the connections of the traveler terminals (i.e., connecting TT1 to TT2), an XOR logic functionality is realized for the different switching states.

The multi-way wiring configuration shown in FIGS. 1A and 1B is one exemplary wiring configuration that is commonly used by electricians for wiring three-way switch devices according to electrical codes. For dimming applications (e.g., light dimming) in a multi-way wiring configuration using conventional multi-way switches (e.g., three-way and/or four-way switches), only one multi-way switch can be implemented to control dimming of the load from one location, despite the multi-way circuit allowing On/Off switching of the load using each multi-way switch in the given multi-way circuit. Exemplary embodiments of the disclosure provide multi-way circuit configurations that implement intelligent electrical switches which allow dimming control from any one of the intelligent electrical switches in the multi-way circuit. In addition, in some embodiments, the exemplary intelligent electrical switches as described herein are configured to replace conventional multi-way electrical switches and enable the reuse of existing residential wiring for multi-way switching circuits (e.g., "three-way" switching of loads), as described and illustrated in FIGS. 1A and 1B. Such reuse of existing wiring eliminates the need for an electrician to run new wiring from a circuit panel.

Figure 2:
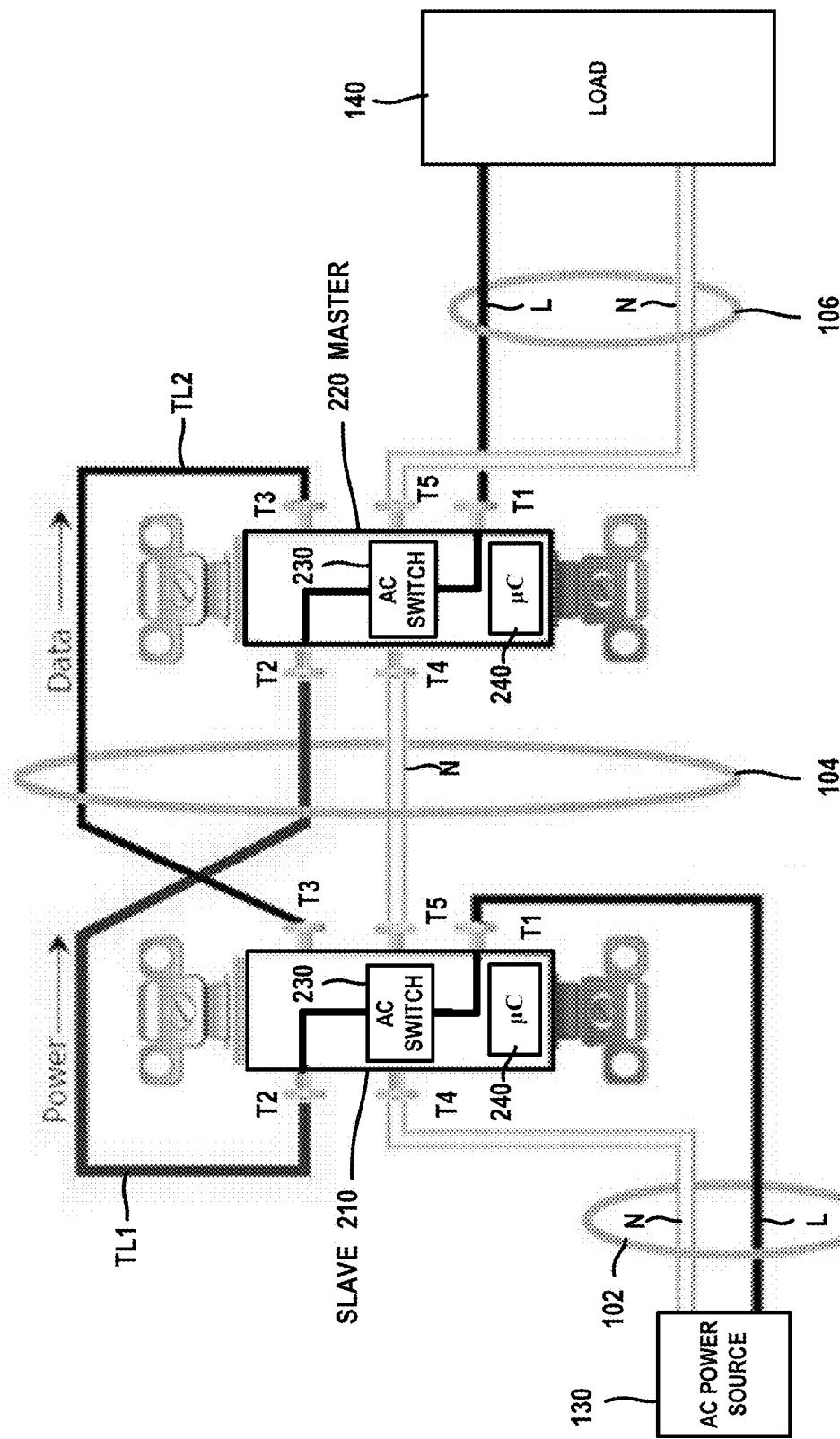
FIG. 2 illustrates a multi-way circuit that is implemented using intelligent electrical switches, according to an exemplary embodiment of the disclosure.

For example, FIG. 2 illustrates a multi-way circuit that is implemented using intelligent electrical switches, according to an exemplary embodiment of the disclosure. In particular, FIG. 2 illustrates a multi-way circuit 200 which comprises a first intelligent electrical switch 210 and a second intelligent electrical switch 220. In some embodiments, the first and second intelligent electrical switches 210 and 220 are identical devices (e.g., have same wiring and circuit architecture, same operating modes, same retailer stock keeping unit (SKI)) number), For example, as shown in FIG. 2, the first and second intelligent electrical switches 210 and 220 each comprise a solid-state AC switch 230 and a microcontroller 240. As explained in further detail below, the microcontroller 240 is configured to control operation of the solid-state AC switch 230 (turn Off, turn ON, drive with a PWM (pulse width modulation) control signal for dimming operation, etc.), and control other functions and operations of the intelligent electrical switch. In addition, the first and second intelligent electrical switches 210 and 220 each comprise a plurality of contact terminals including a first terminal T1, a second terminal T2, a third terminal T3, a fourth terminal T4, and a fifth terminal T5.

For purposes of illustration, FIG. 2 depicts the same 2-wire cables 102 and 106, and the same 3-wire cable 104, as shown in FIG. 1A (i.e., reuse of the existing wiring 102, 104, and 106), but wherein the wires are connected to the different terminals of the intelligent electrical switches 210 and 220 as shown. For example, in the wiring configuration shown in FIG. 2, the hot wire L and the neutral wire N of the two-wire cable 102 are connected to the first terminal T1 and the fourth terminal T4, respectively, of the first intelligent electrical switch 210. In addition, the hot wire L and the neutral wire N of the two-wire cable 106 are connected to the first terminal T1 and the fifth terminal T5, respectively, of the second intelligent electrical switch 220. In addition, the neutral wire N of the three-wire cable 104 is connected to the fifth terminal T5 of the first intelligent electrical switch 210 and to the fourth terminal T4 of the second intelligent electrical switch 220. The first traveler wire TL1 of the three-wire cable 104 is connected to the second terminals T2 of the first and second intelligent electrical switches 210 and 220, and the second traveler wire TL2 of the three-wire cable 104 is connected to the third terminals T3 of the first and second intelligent electrical switches 210 and 220.

As shown in FIG. 2, in some embodiments, in each of the first and second intelligent electrical switches 210 and 220, the solid-state AC switch 230 is serially connected in the electrical path between the first and second terminals T1 and T2. In some embodiments, as explained in further detail below, the solid-state AC switch 230 is configured to operate analogously to a single pole single throw (SPST) switch to control power flow between the first and second terminals T1 and T2 depending on the operating mode (e.g., master mode or slave mode) of the intelligent electrical switch. The fourth and fifth terminals T4 and T5 of the first and second intelligent electrical switches 210 and 220 are utilized to connect the neutral wires (grounded conductors) to the internal circuitry of the first and second intelligent electrical switches 210 and 220 to allow the neutral line from the power source 130 to be utilized as a ground reference for operating the solid-state circuitry first and second intelligent electrical switches 210 and 220 and other functions. This is in contrast to the wiring configuration shown in FIG. 1A where the neutral wires are not connected to the conventional multi-way electrical switches 110 and 120, but rather are just spliced together in the gang boxes using, e.g., wire screws.

In addition, in the exemplary multi-way circuit 200 shown in FIG. 2, the first traveler wire TL1 is utilized to supply power from the first intelligent electrical switch 210 to the second intelligent electrical switch 220, and the second traveler wire TL2 is utilized as a "data" wire to enable serial communication between the first and second intelligent electrical switches 210 and 220, as opposed to transmitting power as in the conventional multi-way circuit 100 of FIGS. 1A and 1B. In some embodiments, while the first and second intelligent electrical switches 210 and 220 are identical in architecture, the intelligent electrical switches are configured to operate in a "master mode" or in a "slave mode" depending on the wiring configuration of the multi-way circuit 200.

More specifically, in some embodiments, an intelligent electrical switch that is connected to the AC power source (e.g., the first intelligent electrical switch 210 in FIG. 2) is configured to operate as a slave switch, while an intelligent electrical switch that is directly connected to the load 140 (e.g., the second intelligent electrical switch 220 in FIG. 2) is configured to operate as a master switch. In addition, any intelligent electrical switch not connected to the load 140 is configured to operate as a slave switch. For example, to implement 4-way switching or more, one or more additional intelligent electrical switches can be connected between the first and second intelligent electrical switches 210 and 220 shown in FIG. 2. As explained in further detail below, on initial power up (e.g., when power is connected to a branch circuit by turning on a circuit breaker), each intelligent electrical switch (e.g., 2 or more) that is connected in a multi-way circuit will perform a master/slave self-identification process to determine whether the given intelligent electrical switch is to operate as a master switch or as a slave switch. The intelligent electrical switch that is connected to the load operates as the master switch which controls power that is delivered to the load based on the states of the master switch and the slave switch(es). Each slave switch (i) communicates its state to the master switch through the data line and (ii) maintains its solid-state AC switch in an ON state at all times to supply power to a downstream intelligent electrical switch (e.g., a slave switch or the master switch). The master switch will control power to the load based on a changed state (e.g., on, off, dimming level) that occurs at a slave switch as a result of, e.g., a user manipulating a control button (e.g., on/off or dimming) of the slave switch.

Figure 3:
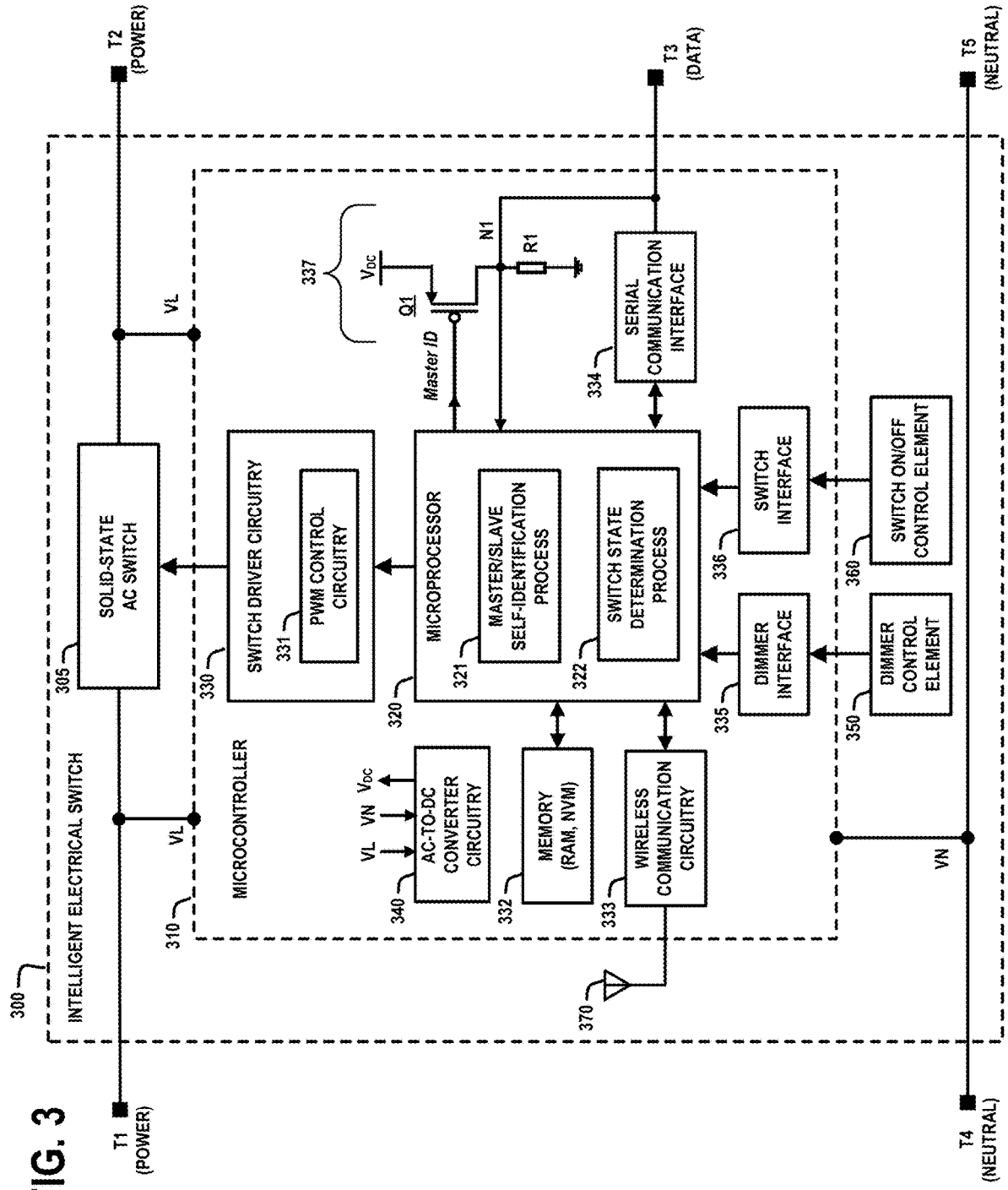
FIG. 3 schematically illustrates an architecture of an intelligent electrical switch, according to an exemplary embodiment of the disclosure.

FIG. 3 schematically illustrates an architecture of an intelligent electrical switch, according to an exemplary embodiment of the disclosure. In particular, FIG. 3 schematically illustrates an intelligent electrical switch 300 which comprise a solid-state AC switch 305 and a microcontroller 310. The microcontroller 310 comprises a microprocessor 320 and a plurality of peripheral circuits connected to the microprocessor 320 including, but not limited to, switch driver circuitry 330 (which comprises PWM control circuitry 331), one or more memory devices 332 (e.g., random-access memory and non-volatile memory), wireless communication circuitry 333, a serial communication interface 334, a dimmer control interface 335, a switch control interface 336, and data line sensing circuitry 337 comprising a data line sensing transistor Q1 and a resistor R1. The microcontroller 310 further comprises power converter circuitry 340 (e.g., AC-to-DC converter circuitry) 340. The intelligent electric switch 300 further comprises a dimmer control element 350, a switch on/off control element 360, and an antenna 370 (for wireless communication functionality).

As further shown in FIG. 3, the intelligent electrical switch 300 comprises a plurality of contact terminals T1, T2, T3, T4, and T5, which are the same or similar to the contact terminals of the intelligent electrical switches 210 and 220 shown and described above in conjunction with FIG. 2. The solid-state AC switch 305 is serially connected in an electrical path between the first and second contact terminals T1 and T2, wherein the contact terminal T1 is configured to connect to, e.g., a power source hot line or a load hot line (e.g., analogous to a common terminal of a conventional three-way switch), and the contact terminal T2 is configured to connect to a power traveler line which is connected to the contact terminal T2 of another intelligent electrical switch. The contact terminal T3 is configured to connect to a data line that connects to the contact terminal T3 of another intelligent electrical switch device to enable serial communication between two or more intelligent electrical switches. The contact terminals T4 and T5 are configured to connect to neutral wires to provide a neutral (grounded conductor) path through the intelligent electrical switch 300 between the contact terminals T4 and T5.

The power converter circuitry 340 is configured to generate a DC power supply voltage (VDC) to provide DC power for operating the circuitry of the microcontroller 310. As schematically illustrated in FIG. 3, the power converter circuitry 340 comprises AC-to-DC circuitry that is connected to power line nodes VL (which are coupled to the contact terminals T1 and T2) a neutral line node VN, and is configured to convert AC power on the nodes VL and VN to a regulated DC supply voltage ($V_{DC}$) that is used to power the various circuit blocks of the microcontroller 310. The power converter circuitry 340 can be implemented using any AC-to-DC circuitry which is suitable for the given application.

In some embodiments, the microprocessor 320 operates the peripheral circuitry through firmware control and executes program code stored in the memory devices 332 to perform various functions. In some embodiments, the microprocessor 320 executes embedded code to perform various logic operations or processes such as a master/slave self-identification process 321 and a switch state determination process 322, the functions of which will be explained in further detail below. In some embodiments, the memory devices 332 comprise volatile RAM memory and non-volatile memory, such as Flash memory, to store configuration data, operational data, executable code for performing various intelligent operations.

The switch driver circuitry 330 is configured to generate control signals to drive one or more gate control terminals of the solid-state AC switch 305 and thereby control the activation and deactivation of the solid-state AC switch 305. In some embodiments, the switch driver circuitry 330 implements the PWM control circuitry 331, which is configured to drive the gate terminal(s) of the solid-state AC switch with PWM control signals with a target duty cycle to implement, e.g., light dimming functions, using known PWM control techniques.

In some embodiments, the wireless communication circuitry 333 comprises a radio frequency (RF) transceiver that is configured to wirelessly communicate with a remote node, device, system, etc., or with another intelligent electrical switch to which it is connected to coordinate switch control functions as discussed herein (in conjunction with or instead of using data line communication over a date line connected to the contact terminal T3). In addition, the wireless communication circuitry 333 can be configured to enable a user or a remote compute node to communicate with the intelligent electrical switch 300, for example, to remotely control the intelligent electrical switch 300 using predetermined commands. The wireless communication circuitry 333 can be implemented any suitable wireless communication protocol such as Wi-Fi or WiMAX, Bluetooth, etc. The antenna 370 can be, e.g., a planar antenna or other type of antenna which is suitable for the given application.

In some embodiments, the serial communication interface 334 implements a half-duplex, asynchronous serial communication protocol in which the communication between two intelligent electrical switches over a data line connected to the contact terminal T3 is synchronized using synchronization information in a transmitted data stream (e.g., start and stop signals, before and after each unit of transmission, respectively). For example, in some embodiments, the serial communication interface 334 can implement a serial communication protocol including, but not limited to, "1-Wire" to enable low-speed data, signaling, and power over a single conductor. In other embodiments, the serial communication process can implement an error detection protocols to provide a robust serial communication interface.

The dimmer control element 350 is configured to allow a user to adjust a dimming level for, e.g., lighting. The dimmer control element 350 can be implemented using known dimmer control elements. For example, the dimmer control element 350 can be a slider control element, a touch pad control element, etc. In other embodiments, the dimmer control element 350 can be implemented using an electronic potentiometer. The dimmer interface 335 comprises a hardware interface that converts dimmer adjustment control signals from the dimmer control element 350 into digital signals that are input to the microprocessor 320 and processed via the switch state determination process 322 to determine a state of the intelligent electrical switch 300.

The switch on/off control element 360 is configured to allow a user to turn power on and off to the load, e.g., lighting. The switch on/off control element 360 can be implemented using known control elements. For example, the switch on/off control element 360 can be a mechanical toggle element, a slider control element, a touch pad control element, etc. The switch interface 336 comprises a hardware interface that converts switch on/off control signals from the switch on/off control element 360 into digital signals that are input to the microprocessor 320 and processed via the switch state determination process 323 to determine a state of the intelligent electrical switch 300.

The data line sensing circuitry 337 is utilized by the microprocessor 320 when executing the master/slave self-identification process 321 (during power up of the intelligent electrical switch 300) to determine if the intelligent electrical switch 300 is to operate in a master mode or slave mode. An exemplary embodiment of the master/slave self-identification process 321 will be discussed in further detail below in conjunction with FIGS. 5 and 6. In some embodiments, the data line sensing transistor Q1 comprises a P-type MOSFET having a gate terminal connected to an input/output pin of the microprocessor 320 (to receives a Master ID control signal), a source terminal coupled to a DC power rail (which comprise the regulated DC supply voltage $V_{DC}$ generated by the power converter circuitry 340), and a drain terminal that is coupled to a sense node N1. The sense node N1 is coupled to an input/output pin of the microprocessor 320 and to the contact terminal T3 (and thus a data line connected to the contact terminal T3). The resistor R1 is coupled to and between the sense node N1 and ground (which is referenced to the neutral node VN). In some embodiments, the resistor R1 has a relatively low resistance (e.g., 100 kiloohms) to enable data line sensing functions as discussed herein, but without perturbing the date line during normal operation when the serial communication interface 334 is communicating with another intelligent electrical switch over the data line connected to the contact terminal T3.

Figure 4:
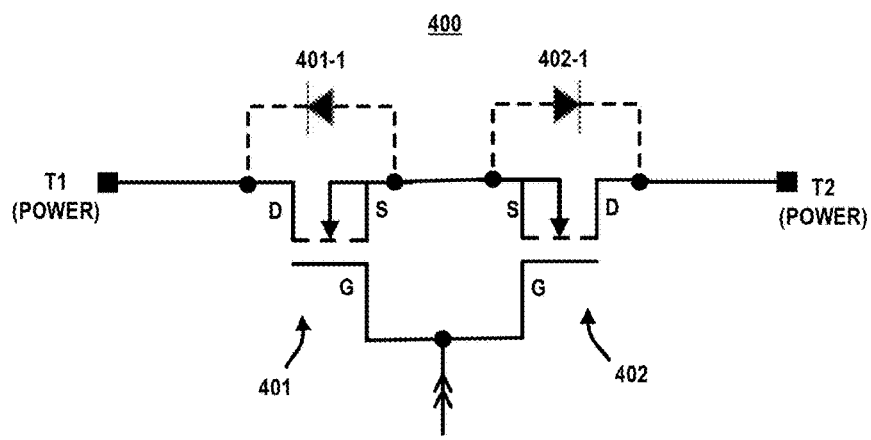
FIG. 4 schematically illustrates a bidirectional solid-state switch which can be utilized to implement a solid-state AC switch of an intelligent electrical switch, according to an exemplary embodiment of the disclosure.

In some embodiments, the solid-state AC switch 305 is implemented using a bidirectional solid-state switch. For example, FIG. 4 schematically illustrates a bidirectional solid-state switch 400 which can be utilized to implement the solid-state AC switch 305 of the intelligent electrical switch 300, according to an exemplary embodiment of the disclosure. The bidirectional solid-state switch 400 comprises a first switch 401 and a second switch 402. In some embodiments, the first and second switches 401 and 402 each comprise a metal-oxide-semiconductor field-effect transistor (MOSFET) switch (e.g., power MOSFET switches). In some embodiments, the first and second switches 401 and 402 comprise N-type enhancement MOSFET devices. The first and second switches 401 and 402 are serially connected back-to-back with commonly connected source (S) terminals, as well as commonly connected gate (G) terminals that are connected to the switch driver circuitry 330 (FIG. 3). The first switch 401 comprises a drain terminal which is coupled to the contact terminal T1, and the second switch 402 comprises a drain terminal which is coupled to the contact terminal T2. The bidirectional solid-state switch 400 configured to (i) allow the bidirectional flow of load current in the electrical path between the contact terminals T1 and T2 when the bidirectional solid-state switch 400 is in a switched-on state and (ii) block the bidirectional flow of load current in the electrical path between the contact terminals T1 and T2 when the bidirectional solid-state switch 400 is in switched-off state.

As further shown in FIG. 4, the first and second switches 401 and 402 comprise intrinsic body diodes 401-1 and 402-1, respectively, where each body diode represents a P-N junction between a P-type substrate body to an N-doped drain region of the MOSFET switch. The body diodes 401-1 and 402-1 are intrinsic elements of the MOSFET switches 401 and 402 (i.e., not discrete elements) and, thus, are shown with dashed-line connections. It is to be noted that the intrinsic body-to-source diodes of the MOSFET switches 401 and 402 are not shown as they are shorted out by the connections between the source regions and the substrate bodies (e.g., N+ source and P-doped body junction are shorted through source metallization).

Figure 5:
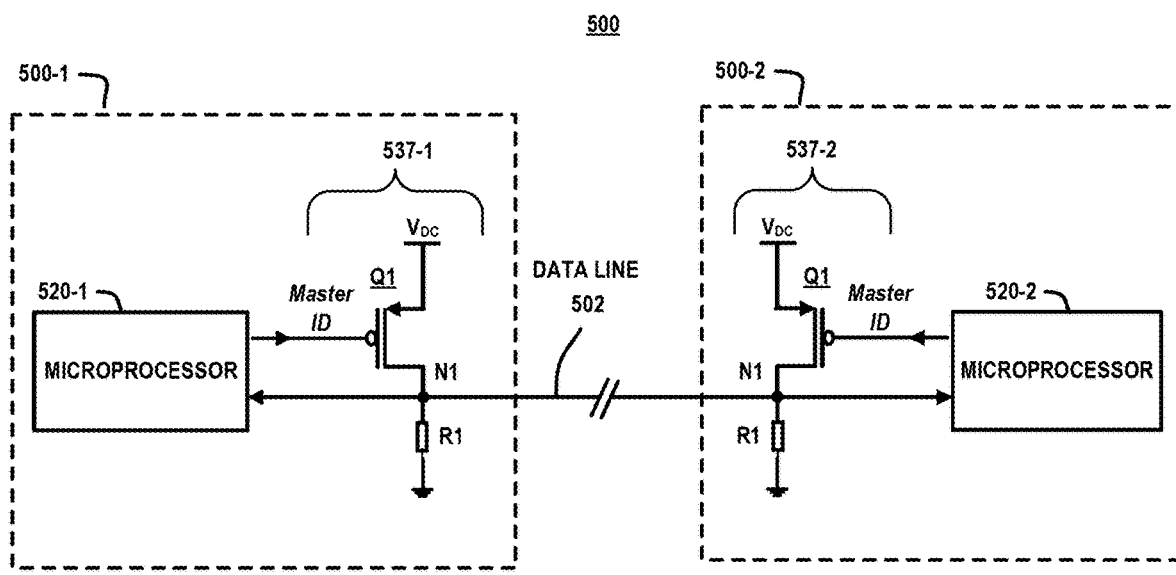
FIG. 5 schematically illustrates a multi-way circuit configuration for performing a master/slave self-identification process between two intelligent electrical switches, according to an exemplary embodiment of the disclosure.

An exemplary master/slave self-identification process will now be discussed in further detail in conjunction with FIGS. 5 and 6. For example, FIG. 5 schematically illustrates a multi-way circuit configuration 500 for performing a master/slave self-identification process between two intelligent electrical switches, according to an exemplary embodiment of the disclosure. In particular, FIG. 5 schematically illustrates a first intelligent electrical switch 500-1 and a second intelligent electrical switch 500-2. The first intelligent electrical switch 500-1 comprises a first microprocessor 520-1, and a first data line sensing circuit 537-1. Similarly, the second intelligent electrical switch 500-2 comprises a second microprocessor 520-2, and a second data line sensing circuit 537-2. The multi-way circuit configuration 500 comprises a data line 502 that is connected to respective sense nodes N1 of the first and second data line sensing circuits 537-1 and 537-2.

As noted above, in some embodiments, the first intelligent electrical switch 500-1 and the second intelligent electrical switch 500-2 have the same or identical architectures, and can operate in a master mode or slave mode, depending on how the first and second intelligent electrical switches 500-1 and 500-2 are wired in the multi-way circuit 500. Upon power up, the first intelligent electrical switch 500-1 and the second intelligent electrical switch 500-2 each perform a master/slave self-identification process to determine if the intelligent electrical device is a master switch or a slave switch.

Figure 6:
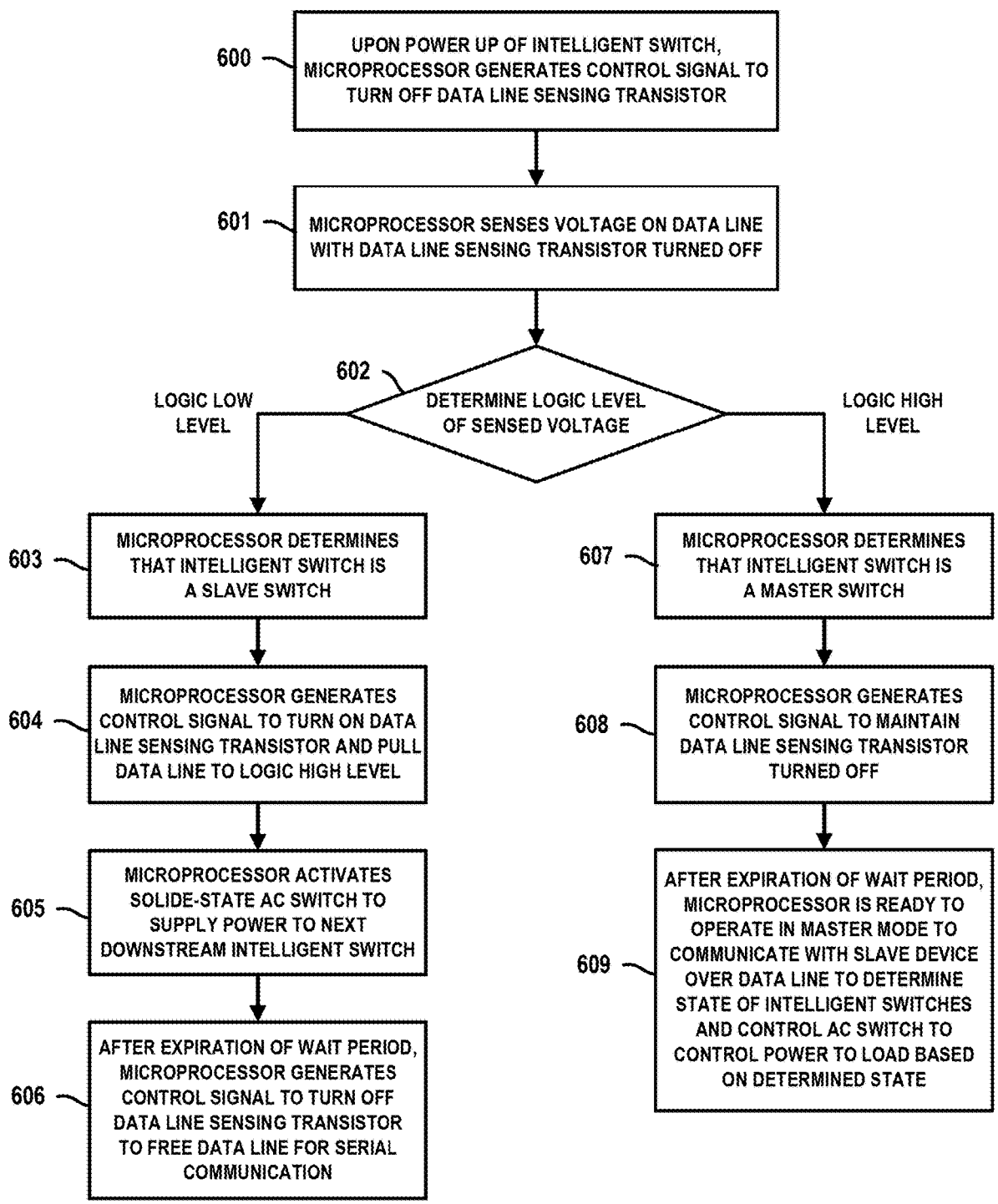
FIG. 6 illustrates a flow diagram of a master/slave self-identification process that is performed by an intelligent electrical switch, according to an exemplary embodiment of the disclosure.

For example, FIG. 6 illustrates a flow diagram of a master/slave self-identification process that is performed by an intelligent electrical switch, according to an exemplary embodiment of the disclosure. In some embodiments, FIG. 6 illustrates an exemplary embodiment of the master/slave self-identification process 321 that is executed by the microprocessor 320 (FIG. 3). For illustrative purposes, the process flow of FIG. 6 will be discussed in the context of the first and second intelligent electrical switches 500-1 and 500-2 in the multi-way circuit configuration 500 of FIG. 5, wherein it is assumed that the first intelligent electrical switch 500-1 is coupled to an AC power source (and is thus a slave switch), and the second intelligent electrical switch 500-2 is coupled to a load, e.g., one or more lighting fixtures (and is thus a master switch).

Upon power up of an intelligent electrical switch, a microprocessor of the intelligent electrical switch generates a control signal to turn off a data line sensing transistor of a data line sensing circuit (block 600). For example, in FIG. 5, assuming that the first intelligent electrical switch 500-1 is coupled to an AC power source through a circuit breaker, when the circuit breaker is switched on, AC power will flow through a branch circuit to the first intelligent electrical switch 500-1. The first intelligent electrical switch 500-1 will essentially wake up due to the power converter circuitry receiving AC power (e.g., at terminals T1 and T4) and generating DC power to turn on the microcontroller and the associated peripheral components. At this point, the solid-state AC switch of the first intelligent electrical switch 500-1 is in an Off state, and no power is yet supplied to the second intelligent electrical switch 500-2 via the power traveler wire coupling the terminals T2 of the first and second intelligent electrical switches 500-1 and 500-2.

In this initial state, the first microprocessor 520-1 generates and outputs a control signal (from a Master ID pin) which is applied to the gate terminal of the data line sensing transistor Q1 of the first data line sensing circuit 537-1 to turn off the data line sensing transistor Q1. For example, in some embodiments, the first microprocessor 520-1 generates and outputs a control signal at a logic 1 level (e.g., gate terminal of Q1 is held at the DC power rail voltage $V_{DC}$), which causes the data line 502 (or sense node N1) to be pulled down by R1 (unless another intelligent electrical switch is pulling the data line 502 up to a logic 1 level). At this time, since the solid-state AC switch of the first intelligent electrical switch 500-1 is in an off state, no power is yet supplied to the second intelligent electrical switch 500-2 such that second intelligent electrical switch 500-2 cannot change a state of the data line 502.

The microprocessor then proceeds to sense a voltage level on the data line (sense node N1) with the data line sensing transistor Q1 turned off (block 601). The microprocessor determines whether the intelligent electrical switch is a master switch or a slave switch based on the sensed logic level of the data line (block 602). If the microprocessor senses a logic low level on the data line (sense node N1), the microprocessor determines that the intelligent electrical switch is a slave switch (block 603). The microprocessor then generates a control signal (which is output from the Master ID pin) which is applied to gate terminal of the data line sensing transistor Q1 to turn on the data line sensing transistor Q1 and pull the data line (sense node N1) to a logic high level (block 604). The microprocessor then activates the solid-state AC switch to cause the slave electrical switch to supply power to the next downstream intelligent electrical switch (block 605). After the expiration of a prespecified wait period, the microprocessor generates a control signal to turn off the data line sensing transistor Q1 to free the data line for serial communication (block 606).

In the exemplary embodiment of FIG. 5, since the first intelligent electrical switch 500-1 is a slave device, the first microprocessor 520-1 will sense a logic low voltage on the data line 502 and determine that the first intelligent electrical switch 500-1 is to operate in slave mode. Since the first microprocessor 520-1 generates a control signal (which is output from the Master ID pin) which is applied to gate terminal of the data line sensing transistor Q1 to turn on the data line sensing transistor Q1 and pull the data line (sense node N1) to a logic high level (in block of a 604), the second intelligent electrical switch 500-2 will subsequently sense a logic high level on the data line and determine that it is a master switch.

For example, referring back to block 600, the second intelligent electrical switch 500-2 will wake up (in block 600) and perform steps 601, and 602 as discussed above. However, in block 602, since the data line is asserted at a logic high level by the first microprocessor 520-1 of the first intelligent electrical switch 500-1, the second microprocessor 520-2 will sense a logic high level data line (sense node N1), and determine that the second intelligent electrical switch 500-2 is a master switch (block 607). The second microprocessor 520-2 then generates a control signal (which is output from the Master ID pin) which is applied to gate terminal of the data line sensing transistor Q1 to turn off (and keep off) the data line sensing transistor Q1 (block 608). After the expiration of a prespecified wait period, the second microprocessor 520-2 is ready to operate the second intelligent electrical switch 500-2 in master mode to communicate with the first intelligent electrical switch 500-1 (slave switch) over the data line to determine the state of the intelligent electrical switches and control the solid-state AC switch of the second intelligent electrical switch 500-2 to control power to the load based on the current states of the first and second intelligent electrical switches (block 609). It is to be noted that in some embodiments, the self-identification process takes a fraction of a second. Once complete, the data line is freed to transmit and receive data.

Once the master/slave self-identification process is complete, the data line is freed up and utilized in various ways. If only the functionality of mechanical switches is to be replaced, then the data line need only be used to indicate the state of the slave (e.g., the slave switch sending its on/off state to the master switch). The master switch would control power to the load based on the switching state (switch position) of the slave switch and the master switch. Furthermore, dimming can be adjusted by operating the dimmer control on the slave switch or master switch, but the master switch will control the PWM control signals applied to its solid-state AC switch to actually control the dimming of the load (which is in contrast to a conventional three-way configuration with two switches where dimming can only be controlled on one end).

A primary functional implementation would be to enable the control of dimming from either switch. In this case, the data line would be used to implement a low-speed asynchronous half duplex communication protocol. The master/slave relationship established during the self-identification protocol upon startup can be carried through to the protocol to be used for half duplex arbitration. As noted above, in some embodiments, a suitable communication protocol including, but not limited to, "1-Wire" can be used for implementing a device communications bus system which provides low-speed data, signaling, and power over a single conductor. The information that would be shared between the master and slave switches includes, e.g., ON/OFF, dimming values, etc. A single data byte transmitted perhaps 10 times per second would be sufficient. The master switch would initiate the transaction and the slave switch would send a response message to the master's message.

For example, FIG. 7 illustrates a flow diagram of a process for controlling power delivered to a load based on a change in state of an intelligent electrical switch operating in a master mode or slave mode, according to an exemplary embodiment of the disclosure. The microprocessor of a given intelligent electrical switch receives input data regarding a state change of the given intelligent electrical switch (block 700). The state change can be, e.g., an activation of a switch on/off control element and/or dimmer control element. The microprocessor determines if the intelligent electrical switch is operating in master mode or slave mode (block 701). If the intelligent electrical switch is operating in master mode, the microprocessor will control the solid-state AC switch of the given intelligent electrical switch to control power to a load based on the change in state of the master intelligent switch (block 702). If the given intelligent electrical switch is operating in slave mode, the microprocessor will transmit information regarding the state of the slave switch to the microprocessor of a master switch (block 703). The microprocessor of the master switch will then control the power to the load based on the change in state of the slave switch (block 704). It is to be noted that the same or similar techniques as discussed above can be applied to implement "four-way switching" and dimming control.

Although exemplary embodiments have been described herein with reference to the accompanying figures, it is to be understood that the current disclosure is not limited to those precise embodiments, and that various other changes and modifications may be made therein by one skilled in the art without departing from the scope of the appended claims.

What is claimed is:

1. An electrical switch, comprising:
a first terminal, a second terminal, and a third terminal;
a solid-state alternating current (AC) switch connected in an electrical path between the first terminal and the second terminal; and
a microcontroller configured to control operation of the solid-state AC switch to control power flow between the first terminal and the second terminal;
wherein the microcontroller is configured to communicate with a second electrical switch over a data line that is connected to the third terminal of the electrical switch and to the second electrical switch, to implement multi-way switch control for controlling power to a load; and
wherein the microcontroller is configured, upon power up, to perform a master/slave self-identification process to determine whether to operate the electrical switch in a master mode or a slave mode, based on sensing a voltage level on the data line that is connected to the third terminal of the electrical switch.

2. The electrical switch of claim 1, wherein the microcontroller is configured to generate a pulse-width modulated control with a variable duty cycle to control operation of the solid-state AC switch to regulate power delivered to the load.

3. The electrical switch of claim 1, wherein:
the microcontroller is configured to operate the electrical switch in the master mode, in response to the master/slave self-identification process sensing a first voltage level on the data line, which indicates that the electrical switch is directly connected to the load; and
the microcontroller is configured to operate the electrical switch in the slave mode, in response to the master/slave self-identification process sensing a second voltage level on the data line, which indicates that the electrical switch is not directly connected to the load.

4. The electrical switch of claim 3, wherein:
in the master mode, the microcontroller is configured to control operation of the solid-state AC switch to control power delivered to the load based at least on a state of the electrical switch and a state of the second electrical switch; and
in the slave mode, the microcontroller is configured to communicate a state of the electrical switch to a second microcontroller of the second electrical switch, to enable the second microcontroller to control power delivered to the load through the second electrical switch based at least on the state of the electrical switch and the state of the second electrical switch.

5. The electrical switch of claim 3, wherein the first voltage level comprises a logic high voltage level, and the second voltage level comprises a logic low voltage level.

6. The electrical switch of claim 1, wherein the microcontroller comprises data line sensing circuitry which is utilized by a microprocessor of the microcontroller to perform the master/slave self-identification process to determine if the electrical switch is to operate in the master mode or the slave mode based on the sensed voltage level on the data line connected to the third terminal.

7. The electrical switch of claim 6, wherein:
the data line sensing circuitry comprises a transistor and a resistor serially connected between a direct current (DC) voltage supply rail and a ground rail;
the transistor comprises gate terminal coupled to an output pin of the microprocessor;
the microprocessor comprises an input pin coupled to a sense node;
the transistor comprises a first source/drain terminal coupled to the DC voltage supply rail and a second source/drain terminal coupled to the sense node;
the resistor comprises a first terminal coupled to the sense node and a second terminal coupled to the ground rail; and
the third terminal of the electrical switch is coupled to the sense node.

8. The electrical switch of claim 1, wherein the microcontroller comprises a serial communication interface that is configured to control serial communication over the data line coupled to the third terminal.

9. The electrical switch of claim 8, wherein the serial communication interface implements a half-duplex, asynchronous serial communication protocol.

10. The electrical switch of claim 1, wherein the solid-state AC switch comprises a bidirectional solid-state switch comprising a first metal-oxide-semiconductor field-effect transistor (MOSFET) switch and a second MOSFET switch.

11. An electrical switch, comprising:
a first terminal, a second terminal, a third terminal, a fourth terminal, and a fifth terminal;
a solid-state alternating current (AC) switch connected in an electrical path between the first terminal and the second terminal;
a microcontroller configured to control operation of the solid-state AC switch to control power flow between the first terminal and the second terminal, wherein the microcontroller is configured to communicate with a second electrical switch over a data line that is connected to the third terminal of the electrical switch and to the second electrical switch, to implement multi-way switch control for controlling power to a load; and
a grounded conductor path between the fourth terminal and the fifth terminal of the electrical switch, wherein the grounded conductor path is coupled to the microcontroller and utilized as a ground reference for operating solid-state circuitry of the microcontroller.

12. The electrical switch of claim 11, wherein:
the microcontroller comprises a power converter circuit, coupled to the first terminal, the second terminal, and the grounded conductor path; and
the power converter circuit is configured to generate a regulated DC power supply voltage for operating the solid-state circuitry of the microcontroller, based on AC power applied to the electrical switch on the first, second, fourth and fifth terminals.

13. An electrical circuit, comprising:
a first electrical switch comprising a first terminal, a second terminal, a third terminal, a first solid-state alternating current (AC) switch connected in an electrical path between the first and second terminals of the first electrical switch, and a first microcontroller configured to control operation of the first solid-state AC switch to control power flow between the first terminal and the second terminal of the first electrical switch; and
a second electrical switch comprising a first terminal, a second terminal, a third terminal, a second solid-state AC switch connected in an electrical path between the first and second terminals of the second electrical switch, and a second microcontroller configured to control operation of the second solid-state AC switch to control power flow between the first terminal and the second terminal of the second electrical switch;
wherein the first microcontroller and the second microcontroller are configured to communicate over a data line that is coupled to the third terminal of the first electrical switch and to the third terminal of the second electrical switch to control the respective first and second solid-state AC switches to implement a multi-way switching circuit for controlling power to a load.

14. The electrical circuit of claim 13, wherein:
the first microcontroller is configured to operate the first electrical switch in a slave mode whereby the first microcontroller maintains the first solid-state AC switch in an on state to allow the first electrical switch to supply continuous power from an AC power source to the second electrical switch; and
the second microcontroller is configured to operate the second electrical switch in a master mode whereby the second microcontroller controls the second solid-state AC switch to control power to the load based on a state of the first electrical switch and a state of the second electrical switch.

15. The electrical circuit of claim 14, wherein in operating the first electrical switch in the slave mode, the first microcontroller is configured to detect a change of state of the first electrical switch, and send a message over the data line to the second microcontroller to provide an indication of the change of state of the first electrical switch, and enable the second microcontroller to control power to the load based on the change of state of the first electrical switch.

16. The electrical circuit of claim 15, wherein the change of state of the first electrical switch comprises a change in a state of an on/off switch of the first electrical switch, wherein the second microcontroller controls operation of the second solid-state AC switch to turn on power to the load or turn off power to the load, based on the change in state of the on/off switch of the first electrical switch.

17. The electrical circuit of claim 15, wherein the change of state of the first electrical switch comprises a change in a dimming level of a dimmer control of the first electrical switch, wherein the second microcontroller controls operation of the second solid-state AC switch adjust an amount of power applied to the load based on the change in the dimming level of the dimmer control of the first electrical switch.

18. A method, comprising:
operating a first electrical switch and a second electrical switch to enable multi-way switching control of power to a load, wherein operating the first electrical switch and the second electrical switch comprises:
performing, by each of the first electrical switch and the second electrical switch, a master/slave self-identification process to enable the first electrical switch and the second electrical switch to determine whether to operate in a master mode or a slave mode, based on sensing a voltage level on a data line connecting the first and second electrical switches;
wherein in response to the first electrical switch determining to operate in the slave mode and the second electrical switch determining to operate in the master mode;
operating the first electrical switch in the slave mode in which the first electrical switch is configured to supply continuous power from an AC power source to the second electrical switch over a power traveler wire connecting the first and second electrical switches; and
operating the second electrical switch in the master mode in which the second electrical switch is configured to control power to the load based on a state of the first electrical switch and a state of the second electrical switch.

19. The method of claim 18, wherein in operating the first electrical switch in the slave mode, the first electrical switch is configured to detect a change of state of the first electrical switch, and send a message over the data line connecting the first and second electrical switches to provide an indication of the change of state of the first electrical switch, and enable the second electrical switch to control power to the load based on the change of state of the first electrical switch.

20. The method of claim 19, wherein the change of state of the first electrical switch comprises at least one of:
a change in a state of an on/off switch of the first electrical switch, wherein the second electrical switch is configured to supply power to the load or interrupt power to the load, based on the change in the state of the on/off switch of the first electrical switch; and a change in a dimming level of a dimmer control of the first electrical switch, wherein the second electrical switch is configured to adjust an amount of power supplied to the load based on the change in the dimming level of the dimmer control of the first electrical switch.

* * * * *